(12) United States Patent  (10) Patent No.: US 8,984,465 B1
Salowe  (45) Date of Patent: Mar. 17, 2015

(54) METHODS, SYSTEMS, AND ARTICLES OF MANUFACTURE FOR AUTOMATICALLY ASSIGNING TRACK PATTERNS TO REGIONS FOR PHYSICAL IMPLEMENTATION OF AN ELECTRONIC DESIGN

(71) Applicant: Cadence Design Systems, Inc., San Jose, CA (US)

(72) Inventor: Jeffrey S. Salowe, Los Gatos, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/931,707

(22) Filed: Jun. 28, 2013

(51) Int. Cl.
  *G06F 17/50* (2006.01)
(52) U.S. Cl.
  CPC .................................. *G06F 17/5072* (2013.01)
  USPC ........................................................ 716/122
(58) Field of Classification Search
  USPC .................................................. 716/100, 122
  See application file for complete search history.

(56) References Cited

U.S. PATENT DOCUMENTS

| | | | |
|---|---|---|---|
| 2,915,831 A | 12/1959 | Parker | |
| 4,484,292 A | 11/1984 | Hong et al. | |
| 4,811,237 A | 3/1989 | Putatunda et al. | |
| 5,535,134 A | 7/1996 | Cohn et al. | |
| 5,644,500 A | 7/1997 | Miura et al. | |
| 5,729,469 A | 3/1998 | Kawakami | |
| 5,770,481 A * | 6/1998 | Fujii ............................. | 438/129 |
| 6,011,912 A | 1/2000 | Yui et al. | |
| 6,298,468 B1 | 10/2001 | Zhen | |
| 6,324,675 B1 | 11/2001 | Dutta et al. | |
| 6,349,403 B1 | 2/2002 | Dutta et al. | |
| 6,407,434 B1 | 6/2002 | Rostoker et al. | |
| 6,490,713 B2 | 12/2002 | Matsumoto | |
| 6,505,333 B1 | 1/2003 | Tanaka | |
| 6,543,041 B1 | 4/2003 | Scheffer et al. | |
| 6,557,145 B2 | 4/2003 | Boyle et al. | |
| 6,557,153 B1 | 4/2003 | Dahl et al. | |
| 6,609,237 B1 | 8/2003 | Hamawaki et al. | |
| 6,763,512 B2 | 7/2004 | Xing | |
| 6,769,105 B1 | 7/2004 | Teig et al. | |
| 6,851,100 B1 | 2/2005 | You et al. | |
| 6,892,371 B1 | 5/2005 | Teig et al. | |
| 6,938,234 B1 | 8/2005 | Teig et al. | |
| 6,957,407 B2 | 10/2005 | Suto | |
| 6,957,411 B1 | 10/2005 | Teig et al. | |
| 6,981,235 B1 | 12/2005 | Salowe et al. | |

(Continued)

OTHER PUBLICATIONS

Dion et al., Contour: A Tile-based Gridless Router, 30 pages, Western Research Laboratory, Mar. 1995.

(Continued)

*Primary Examiner* — Suchin Parihar
(74) *Attorney, Agent, or Firm* — Vista IP Law Group, LLP

(57) ABSTRACT

Various aspects described herein identify an area in an electronic design, identify a set of track patterns or track pattern groups for the area based on a set of criteria, and iteratively implement the electronic design in the area using at least some of the set of track patterns. These aspects may dynamically or iteratively update the assignment of one or more track patterns to the region based at least in part upon the implementation of the electronic design in the area or one or more attributes of one or more other areas on the same layer as the current layer of interest or on one or more different layers.

27 Claims, 13 Drawing Sheets

(56) References Cited

U.S. PATENT DOCUMENTS

| | | | |
|---|---|---|---|
| 6,996,512 B2 | 2/2006 | Alpert et al. | |
| 7,016,794 B2 | 3/2006 | Schultz | |
| 7,039,881 B2 | 5/2006 | Regan | |
| 7,051,313 B1 | 5/2006 | Betz et al. | |
| 7,076,750 B1 | 7/2006 | Lukanc | |
| 7,089,526 B1 | 8/2006 | Salowe et al. | |
| 7,096,445 B1 | 8/2006 | Pucci et al. | |
| 7,100,128 B1 | 8/2006 | Nequist et al. | |
| 7,107,564 B1 | 9/2006 | Teig et al. | |
| 7,117,468 B1 | 10/2006 | Teig et al. | |
| 7,222,322 B1 | 5/2007 | Chyan et al. | |
| 7,257,797 B1 | 8/2007 | Waller et al. | |
| 7,363,607 B2 | 4/2008 | Birch et al. | |
| 7,516,433 B1 | 4/2009 | Pucci et al. | |
| 7,523,430 B1 | 4/2009 | Patel | |
| 7,594,214 B1 | 9/2009 | Salowe et al. | |
| 7,657,852 B2 * | 2/2010 | Waller | 716/119 |
| 7,694,261 B1 | 4/2010 | Chyan et al. | |
| 7,752,590 B1 | 7/2010 | Chyan et al. | |
| 7,802,208 B1 | 9/2010 | Waller et al. | |
| 7,890,909 B2 | 2/2011 | Pyapali et al. | |
| 7,934,177 B2 | 4/2011 | Shin | |
| 7,958,480 B1 | 6/2011 | Slonim et al. | |
| 8,006,216 B1 | 8/2011 | Chen et al. | |
| 8,028,253 B2 | 9/2011 | Drapeau | |
| 8,032,856 B2 | 10/2011 | Itagaki | |
| 8,239,806 B2 | 8/2012 | Chen et al. | |
| 8,375,348 B1 | 2/2013 | Raj et al. | |
| 8,418,110 B2 | 4/2013 | Keinert et al. | |
| 8,490,036 B2 * | 7/2013 | Waller | 716/106 |
| 8,495,547 B2 * | 7/2013 | Keinert et al. | 716/120 |
| 8,495,549 B2 * | 7/2013 | Maruyama et al. | 716/126 |
| 8,510,703 B1 | 8/2013 | Wadland et al. | |
| 8,560,998 B1 | 10/2013 | Salowe et al. | |
| 8,640,080 B1 | 1/2014 | Salowe et al. | |
| 8,645,893 B1 | 2/2014 | Yeung et al. | |
| 8,683,418 B2 | 3/2014 | Bose et al. | |
| 8,689,121 B2 | 4/2014 | O'Riordan | |
| 8,769,455 B1 | 7/2014 | Singh et al. | |
| 8,782,586 B2 * | 7/2014 | Sezginer et al. | 716/126 |
| 2001/0038612 A1 | 11/2001 | Vaughn | |
| 2003/0014201 A1 | 1/2003 | Schultz | |
| 2003/0084418 A1 | 5/2003 | Regan | |
| 2003/0126578 A1 * | 7/2003 | Wadland et al. | 716/12 |
| 2006/0288323 A1 | 12/2006 | Birch | |
| 2007/0044060 A1 * | 2/2007 | Waller | 716/13 |
| 2007/0101303 A1 | 5/2007 | Lien | |
| 2007/0106969 A1 | 5/2007 | Birch et al. | |
| 2007/0162884 A1 | 7/2007 | Matsuno et al. | |
| 2008/0072182 A1 | 3/2008 | He et al. | |
| 2008/0244504 A1 | 10/2008 | Drapeau | |
| 2009/0055792 A1 | 2/2009 | Itagaki | |
| 2009/0144688 A1 | 6/2009 | Uchino et al. | |
| 2009/0172628 A1 | 7/2009 | Chyan | |
| 2010/0011327 A1 | 1/2010 | Becker et al. | |
| 2010/0037200 A1 | 2/2010 | Ghan | |
| 2010/0100862 A1 | 4/2010 | Ohtsuka | |
| 2010/0106274 A1 | 4/2010 | Konno et al. | |
| 2010/0115479 A1 | 5/2010 | Hatano et al. | |
| 2010/0122227 A1 * | 5/2010 | Waller | 716/5 |
| 2010/0122228 A1 | 5/2010 | McCracken et al. | |
| 2010/0199253 A1 | 8/2010 | Cheng et al. | |
| 2010/0205575 A1 | 8/2010 | Arora et al. | |
| 2010/0229140 A1 | 9/2010 | Strolenberg et al. | |
| 2010/0306727 A1 | 12/2010 | Itagaki | |
| 2011/0014786 A1 * | 1/2011 | Sezginer et al. | 438/618 |
| 2011/0055784 A1 | 3/2011 | Gao et al. | |
| 2011/0119648 A1 | 5/2011 | Chen et al. | |
| 2011/0185329 A1 | 7/2011 | Wen et al. | |
| 2011/0214100 A1 | 9/2011 | McElvain | |
| 2011/0219341 A1 | 9/2011 | Cao et al. | |
| 2011/0260318 A1 | 10/2011 | Eisenstadt | |
| 2011/0296360 A1 | 12/2011 | Wang et al. | |
| 2012/0079442 A1 | 3/2012 | Akar et al. | |
| 2012/0131528 A1 | 5/2012 | Chen et al. | |
| 2013/0019220 A1 * | 1/2013 | Maruyama et al. | 716/126 |
| 2013/0036396 A1 | 2/2013 | Arayama et al. | |
| 2013/0086543 A1 | 4/2013 | Agarwal et al. | |
| 2013/0086545 A1 | 4/2013 | Alpert et al. | |
| 2013/0155555 A1 | 6/2013 | Blanc et al. | |
| 2013/0159965 A1 | 6/2013 | Karatal et al. | |
| 2014/0157220 A1 | 6/2014 | Arayama et al. | |
| 2014/0167117 A1 | 6/2014 | Quandt et al. | |

OTHER PUBLICATIONS

Wang et al., "System on Chip Test Architecture", 2007.

Ou et al., "Simultaneous Analog Placement and Routing with Current Flow and Current Density Considerations", 2013.

Jeffrey Salowe, "Gridding for Advanced Process Nodes" 2012.

U.S. Appl. No. 12/980,744, filed Dec. 29, 2010.

U.S. Appl. No. 13/602,071, filed Aug. 31, 2012.

U.S. Appl. No. 13/602,069, filed Aug. 31, 2012.

U.S. Appl. No. 13/705,164, filed Dec. 4, 2012.

U.S. Appl. No. 13/719,058, filed Dec. 18, 2012.

Cho et al., "Double Patterning Technology Friendly Detailed Routing", IEEE/ACM International Conference, 2008, pp. 506-511.

Li et al., "NEMO: A New Implicit-Connection Graph-Based Gridless Router With Multilayer Planes and Pseudo Tile Propagation," IEEE Trans. on CAD of ICs & Systems, vol. 26, No. 4 Apr. 2007, pp. 705-718.

Lin et al., "Double Patterning Lithography Aware Grid less Detailed Routing with Innovative Conflict Graph," DAC'10, Jun. 13-18, 2010, pp. 398-403.

Hsu et al., "Template-Mask Design Methodology for Double Patterning Technology," 2010 IEEE, pp. 107-111.

U.S. Appl. No. 13/692,970, filed Dec. 3, 2012.

Final Office Action dated Jul. 17, 2014 for U.S. Appl. No. 13/931,503.

Non-Final Office Action dated Aug. 4, 2014 for U.S. Appl. No. 13/931,568.

Non-Final Office Action dated Jul. 15, 2014 for U.S. Appl. No. 14/044,838.

Hwang, Chanseok, and Massoud Pedram. "Interconnect design methods for memory design." Proceedings of the 2004 Asia and South Pacific Design Automation Conference. IEEE Press, 2004.

Jones, David L., "PCB Design Tutorial, Revision A", Jun. 29, 2004, David L. Jones and www.alternatezone.com, pp. 1-25.

Lin, I-Jye, Tsui-Yee Ling, and Yao-Wen Chang. "Statistical circuit optimization considering device and interconnect process variations." Proceedings of the 2007 international workshop on System level interconnect prediction. ACM, 2007.

Pompl, T., et al. "Practical aspects of reliability analysis for IC designs." Proceedings of the 43rd annual Design Automation Conference. ACM, 2006.

Singh, Jaskirat, and Sachin S. Sapatnekar. "Topology optimization of structured power/ground networks." Proceedings of the 2004 international symposium on Physical design. ACM, 2004.

Agilent Technologies, "Momentum", 2006, Agilient, pp. 1-40.

Non-Final Office Action dated Sep. 19, 2013 for U.S. Appl. No. 13/602,071.

Notice of Allowance dated Mar. 21, 2014 for U.S. Appl. No. 13/602,071.

Notice of Allowance dated Jul. 14, 2014 for U.S. Appl. No. 13/602,071.

Ex-parte Quayle Office Action dated May 23, 2014 for U.S. Appl. No. 13/602,069.

Non-Final Office Action dated Sep. 20, 2013 for U.S. Appl. No. 13/602,069.

Final Office Action dated Oct. 4, 2013 for U.S. Appl. No. 13/705,164.

Non-Final Office Action dated Jun. 5, 2013 for U.S. Appl. No. 13/705,164.

Non-Final Office Action dated Sep. 3, 2014 for U.S. Appl. No. 13/705,164.

(56) References Cited

OTHER PUBLICATIONS

Notice of Allowance dated Jan. 22, 2014 for U.S. Appl. No. 13/705,164.
Notice of Allowance dated May 16, 2014 for U.S. Appl. No. 13/705,164
Notice of Allowance dated Nov. 10, 2014 for U.S. Appl. No. 13/931,503.
Final Office Action dated Nov. 13, 2014 for U.S. Appl. No. 14/044,836.
Non-Final Office Action dated Dec. 19, 2014 for U.S. Appl. No. 14/318,507.

* cited by examiner

800 Command for Setting Track Patterns:

Set_track_pattern –start <start> –repeat <repeat> –x <bool> –spacing <value> –name "<name>" –layer <layer> –constraint_group "<rule>" -pattern_group_name "<pattern group name"

802 First Track Patterns:

Set_track_pattern –start s1 –repeat 10000 –x false –spacing val1 –name "1xTrack1" –layer M2 –constraint_group "onex-rule" – pattern_group_name "1x"

804 Second Track Patterns:

Set_track_pattern –start s2 –repeat 10000 –x false –spacing val2 –name "1xTrack2" –layer M2 –constraint_group "onex-rule" – pattern_group_name "1x+2x"

806 Third Track Patterns:

Set_track_pattern –start s3 –repeat 10000 –x false –spacing val3 –name "2xTrack1" –layer M2 –constraint_group "twox-rule" – pattern_group_name "1x+2x"

808 Rule Specification to Permit Physical Implementation Tool to Use Either 1xTrack1 Or 1xTrack2:
M2 trackPattern constraint "1xTrack1+1xTrack2"

FIG. 8A

822 Construct Tessellation Structure:

set_tessellation_pattern –x false –start <start> -spacing <spacing> -repeat <repeat> -layer <layer>

824 Label A Region of Tessellation:

Label_tessellation –region {xlo ylo xhi yhi} –name "track_pattern_name" –layer <layer>

FIG. 8B

METHODS, SYSTEMS, AND ARTICLES OF MANUFACTURE FOR AUTOMATICALLY ASSIGNING TRACK PATTERNS TO REGIONS FOR PHYSICAL IMPLEMENTATION OF AN ELECTRONIC DESIGN

CROSS-REFERENCE TO RELATED APPLICATION(S)

This Application is related to U.S. patent application Ser. No. 13/931,568 and entitled "METHODS, SYSTEMS, AND ARTICLES OF MANUFACTURE FOR INTERACTIVELY IMPLEMENTING PHYSICAL ELECTRONIC DESIGNS WITH TRACK PATTERNS", U.S. patent application Ser. No. 13/931,627 entitled "METHODS, SYSTEMS, AND ARTICLES OF MANUFACTURE FOR ASSIGNING TRACK PATTERNS TO REGIONS OF AN ELECTRONIC DESIGN", U.S. patent application Ser. No. 13/931,689 entitled "METHODS, SYSTEMS, AND ARTICLES OF MANUFACTURE FOR ASSOCIATING TRACK PATTERNS WITH ROUTING FOR ELECTRONIC DESIGNS", and U.S. patent application Ser. No. 13/931,503 entitled "METHODS, SYSTEMS, AND ARTICLES OF MANUFACTURE FOR IMPLEMENTING A PHYSICAL ELECTRONIC DESIGN WITH AREA-BOUNDED TRACKS", the content of all four U.S. patent applications is hereby expressly incorporated by reference in its entirety for all purposes.

COPYRIGHT NOTICE

A portion of the disclosure of this patent document includes material, which is subject to copyright protection. The copyright owner has no objection to the facsimile reproduction by anyone of the patent document or the patent disclosure, as it appears in the United States Patent and Trademark Office patent file or records, but otherwise reserves all copyright rights whatsoever.

BACKGROUND

Integrated circuits, or ICs, are created by patterning a substrate and materials deposited on the substrate. The substrate is typically a semiconductor wafer. The patterned features make up devices and interconnections. This process generally starts with a designer creating an integrated circuit by hierarchically defining functional components of the circuit using a hardware description language. From this high-level functional description, a physical circuit implementation dataset is created, which is usually in the form of a netlist. This netlist identifies logic cell instances from a cell library, and describes cell-to-cell connectivity.

Many phases of these electronic design activities may be performed with computer aided design (CAD) tools or electronic design automation (EDA) systems. For example, an integrated circuit designer may use a set of layout EDA application programs, such as a layout editor, to create a physical integrated circuit design layout from a logical circuit design. The layout EDA application uses geometric shapes of different materials to create the various electrical components on an integrated circuit and to represent electronic and circuit IC components as geometric objects with varying shapes and sizes. After an integrated circuit designer has created an initial integrated circuit layout, the integrated circuit designer then verifies and optimizes the integrated circuit layout using a set of EDA testing and analysis tools. Verification may include, for example, design rule checking to verify compliance with rules established for various IC parameters. The EDA layout editing tools are often performed interactively so that the designer can review and provide careful control over the details of the electronic design.

Typically, geometric information about the placement of the nodes and components onto the chip is determined by a placement process and a routing process. The placement process is a process for placing electronic components or circuit blocks on the chip and the routing process is the process for creating interconnections between the blocks and components according to the specified netlist. The task of all routers is the same—routers are given some pre-existing polygons consisting of pins on cells and optionally some pre-routes from the placers to create geometries so that all pins assigned to different nets are connected by wires and vias, that all wires and vias assigned to different nets do not overlap, and that all design rules are obeyed. That is, a router fails when two pins on the same net that should be connected are open, when two pins on two different nets that should remain open are shorted, or when some design rules are violated during routing.

A layout file is created from the placement and routing process, which assigns logic cells to physical locations in the device layout and routes their interconnections. The physical layout is typically described as many patterned layers, and the pattern of each layer is described by the union of a set of polygons. The layout data set is stored, for example in GDSII ("Graphic Data System II") or OASIS ("Open Artwork System Interchange Standard") formats. Component devices and interconnections of the integrated circuit are constructed layer by layer. A layer is deposited on the wafer and then it is patterned using a photolithography process and an etch process.

Traditionally, layout track patterns include parallel tracks with uniform pitches, and these tracks cover the entire layout space. This conventional approach does not satisfy the needs for electronic layouts with a typical half-pitch of 14 nm or below. With the half-pitch advancing to 14 nm or below, the track patterns for a certain metal layer may be required or desired to be region based where one track pattern may be associated with or assigned to a region on one layer, while another track pattern may be associated with or assigned to another region on the same layer. Some designs may even demand or desire non-uniform track patterns. Conventional approaches also do not allow periodic changes of track pitches and definitions of regions where one or more track pattern are active. These track pattern requirements pose a challenge for physical design implementation, especially for interactive layout editing. In addition, users may need to be able to interactively define the track patterns during the chip floorplanning or placement stage and follow these track patterns during subsequent physical design stages such as routing, post-layout optimization, engineering change order (ECO), or even specific physical design tasks such as wire editing.

In addition, advanced manufacturing groups have new requirements on where wires or interconnects may be routed. In particular, some routing tracks are intended for double-width wires, some are intended for single-width wires, and so on. Routing tracks, as they were originally devised, applied to every net or connection in the design. To address this, the user must explicitly add the constraints of the track patterns to the routing rules, which is impractical and prone to errors. Moreover, there has been no way to address trackPattern constraints on automatically-generated rules. Some advanced technologies have complex grid requirements. One such requirement is to restrict routing grids in a particular area. Another approach is to give several possible sets of grids, and then to assign one to a given area. The current track pattern representation applies to an entire layer. There is no representation that limits the bounds of a track pattern. Nor is there a representation that maps track patterns to a particular area Thus, there exists a need for methods, systems, and articles of manufacture for assigning track patterns to regions of an electronic design.

SUMMARY

Disclosed are method(s), system(s), and article(s) of manufacture for implementing a physical electronic design with area-bounded tracks in one or more embodiments. Certain advanced foundries have added complicated routing track requirements. One such requirement is the one explained in application 12PA148, where various track patterns are mapped to different chip regions. That is, track pattern A is active in region X on layer L, track pattern B is active in region Y on layer L, and so on. That invention introduced the notion of a tessellation, which gave an explicit mapping to regions on a layer. In this invention, we deal with how the track pattern groups are mapped to the tessellation. Given a set of track patterns on a layer, determine the tessellation and the pattern-group mapping to the regions so that all detail routes can be feasibly assigned to tracks.

Some advanced foundries have added complicated routing track requirements. One such requirement is where various track patterns are mapped to different chip regions. One aspect described herein maps track pattern groups to tessellation patterns of an area of an electronic design. These embodiments identify a set of track patterns on a layer, determine a tessellation pattern including multiple regions, and map the track patterns to these multiple regions for implementation of the electronic design. For example, a detail router may employ various processes or modules described herein so that interconnects or wires may be automatically assigned to tracks during detail routing to comply with the on-track rules.

Some embodiments identify a set of track patterns that match a circuit feature in an area of an electronic design, implement the circuit feature in the area of the electronic design by using at least a part of the set of track patterns, and updating assignment of one or more track patterns to the area. Some of these embodiments may dynamically or iteratively update the assignment based at least in part upon a result of implementing multiple circuit features in the area. As the implementation of the electronic design in the area proceeds by adding more circuit features, the matching track patterns may be iteratively limited by at least some of the added circuit features. Some embodiments may thus iteratively or dynamically modify or update the assignment accordingly. The assignment of one or more track patterns to the area may also be affected by an existing circuit feature in the current area of interest or in one or more other areas on the same layer as the current area or on one or more different areas. When the implementation process for an area in an electronic design is first initiated, some embodiments may make all track patterns available to the area, if the area does not contain any existing circuit features that affect track pattern assignment.

Some embodiments dynamically label regions on a layer of an electronic design with their corresponding track pattern groups or track patterns. In these embodiments where an area of an electronic design is first tessellated to form multiple regions, the method maintains a list of possible labels for the regions determined by the tessellation, rather than providing a definitive label for each region. In these embodiments where there are no shapes in these multiple regions, all track pattern groups or track patterns are allowed. These embodiments maintain a list that includes valid track pattern groups or track patterns that may be assigned to each region. During the implementation of an electronic design where circuit features are added, removed, or modified, the valid track patterns or track pattern groups are adjusted accordingly. For example, some wire widths and locations will match certain track patterns or track pattern groups but not others. Therefore, the implementation of the electronic design may modify these possible labels for each region. Some embodiments dynamically maintain the mapping or association between regions and track patterns in a tessellation structure by using rankings, counts, or scores (hereinafter "count" collectively) for track patterns to monitor the assignment of a track pattern or a track pattern group to a region with a small number of errors. Various embodiments may also use this tessellation structure during a rip-up and reroute process, a post-route optimization process, or an engineering change order (ECO) process.

Some embodiments are directed at a hardware system that may be invoked to perform any of the methods, processes, or sub-processes disclosed herein. The hardware system may include at least one processor or at least one processor core, which executes one or more threads of execution to perform any of the methods, processes, or sub-processes disclosed herein in some embodiments. The hardware system may further include one or more forms of non-transitory machine-readable storage media or devices to temporarily or persistently store various types of data or information. Some exemplary modules or components of the hardware system may be found in the System Architecture Overview section below.

Some embodiments are directed at an article of manufacture that includes a non-transitory machine-accessible storage medium having stored thereupon a sequence of instructions which, when executed by at least one processor or at least one processor core, causes the at least one processor or the at least one processor core to perform any of the methods, processes, or sub-processes disclosed herein. Some exemplary forms of the non-transitory machine-readable storage media may also be found in the System Architecture Overview section below.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIGS. 8A-B illustrate some exemplary command syntax for in some embodiments.

DETAILED DESCRIPTION

Various embodiments of the invention are directed to a methods, systems, and articles of manufacture for implementing high current carrying interconnects. Other objects, features, and advantages of the invention are described in the detailed description, figures, and claims.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration.

Disclosed are method(s), system(s), and article(s) of manufacture for automatically assigning track patterns or track pattern groups to regions for physical implementation of an electronic design in one or more embodiments. Unless otherwise specifically recited or claimed, the terms "track pattern" and "track pattern group" may be used interchangeably to represent a collection of tracks in this application.

Figure 1:
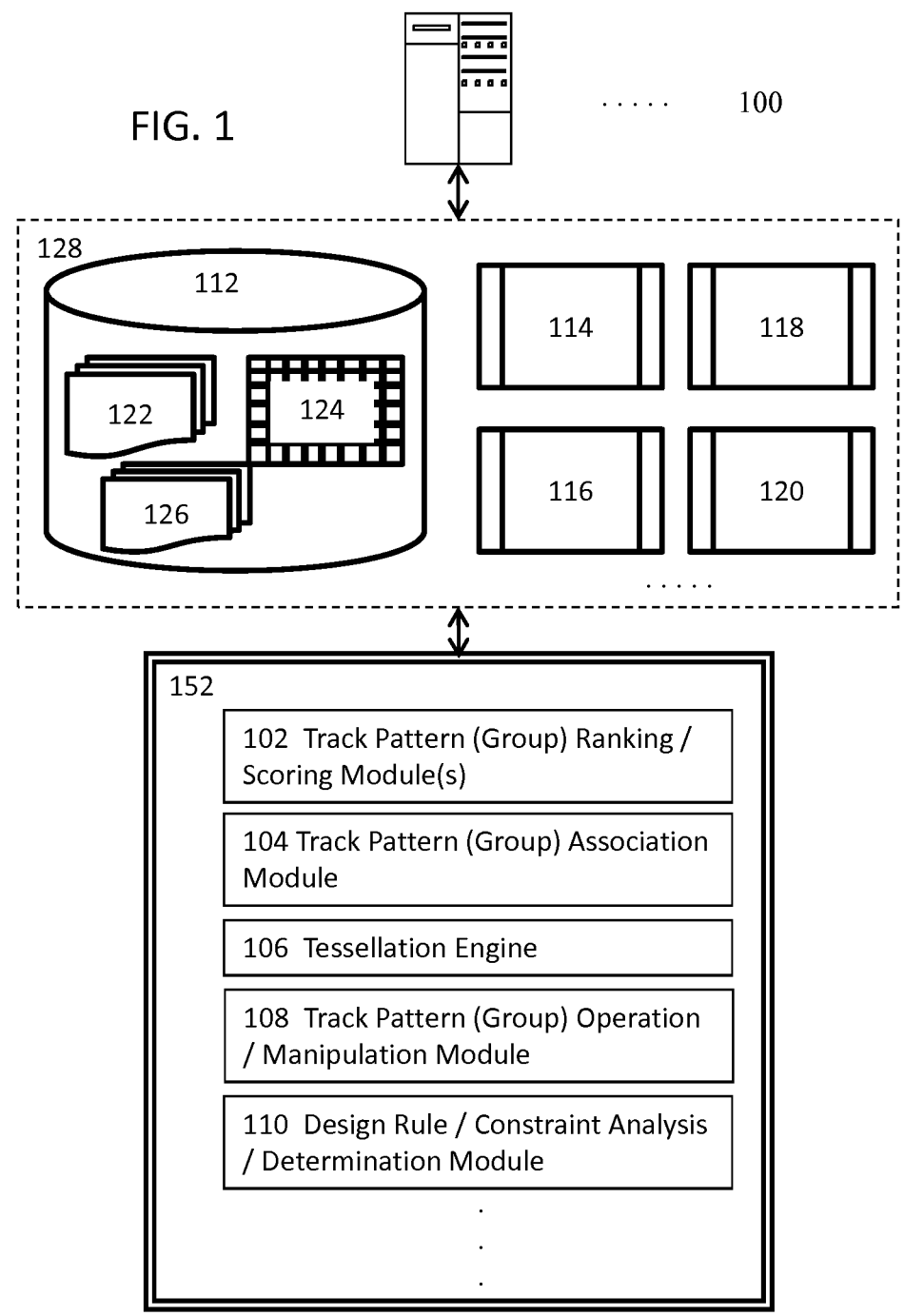
FIG. 1 illustrates a high level block diagram for a system for automatically assigning track patterns to regions for physical implementation of an electronic design in some embodiments.

FIG. 1 illustrates a high level block diagram for a system for automatically assigning track patterns to regions for physical implementation of an electronic design in some embodiments. In one or more embodiments, the system for interactively implementing physical electronic designs with track patterns may comprise one or more computing systems 100, such as a general purpose computer described in the System Architecture Overview section to implement one or more special proposes.

In some embodiments, the one or more computing systems 100 may invoke various system resources such as the processor(s) or processor core(s), memory, disks, etc. The one or more computing systems 100 may also initiate or interact with other computing systems to access various resources 128 that may comprise a global routing engine and/or a detail routing engine 114, a layout editor 116, a design rule checker 118, a verification engine 120, or a floorplanner, etc. The one or more computing systems 100 may further write to and read from a local or remote volatile or non-volatile computer accessible storage 112 that stores thereupon data or information such as, but not limited to, one or more databases (124) such as schematic design database(s) or physical design database(s), libraries, data, rule decks, constraints, etc. (122), or other information or data (126) that may be used to facilitate the performance of various functions to achieve the intended purposes.

In some embodiments, the one or more computing systems 100 may, either directly or indirectly through various resources 128 to invoke various software, hardware modules or combinations thereof 152 that may comprises a track pattern or track pattern group module 102 to rank or score a plurality of track patterns based on one or more criteria, an interactive design editing module 104 to provide the capabilities of interactive editing (e.g., adding, removing, or modifying) any part of an electronic design, a tessellation module 106 to tessellate an area of an electronic design into strips and to tessellate a strip into multiple regions either alone or jointly with one or more other modules, one or more interactive coloring modules 108 to provide interactive coloring capabilities for providing correct-by-construction electronic designs to be manufactured with multi-exposure techniques, various physical implementation tools such as a global router or a detail router, a layout or physical design editor, one or more modules 110 to perform design rule checks, constraint analysis (e.g., interactive constraint analysis), or to make various determinations, a constraint or connectivity awareness module 112 to provide a constraint and/or connectivity-aware environment to implement electronic designs, etc.

For example, the method or system may interactively check whether an electronic design complies with various constraints or design rules (collectively constraints), such as some net-based spacing constraints that impose some limitations on the spacing between two nets, in a nearly real-time manner while the electronic design is being created in some embodiments. In these embodiments, the disclosed method or system uses the connectivity information provided by a connectivity engine or assigned by a designer to present feedback to a user as to whether a newly created object or a newly modified object complies or violates certain relevant constraints in an interactive manner or in nearly real-time without having to perform such constraints checking in batch mode. More details about the aforementioned modules will become clear and self-explanatory in the remainder of the description with reference to various other drawing figures.

Figure 2:
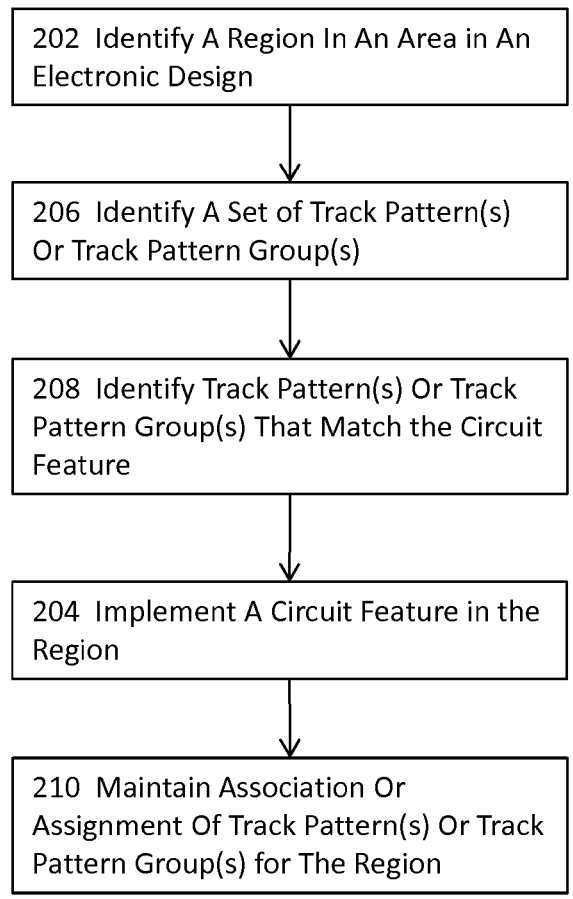
FIG. 2 illustrates a high level flow diagram for automatically assigning track patterns to regions for physical implementation of an electronic design in some embodiments.

FIG. 2 illustrates a high level flow diagram for automatically assigning track patterns to regions for physical implementation of an electronic design in some embodiments. In one or more embodiments, the method for automatically assigning track patterns to regions for physical implementation of an electronic design may comprise the process 202 of identifying a region in an area in an electronic design. An area may comprise a portion of a layer of the electronic design in some embodiments. For example, an area may comprise a custom or user defined portion on a layer of an electronic design or the extent of an IP block (e.g., a processor) in the electronic design. In some other embodiments, an area may comprise the entire layer of the electronic design.

A region may comprise at least a portion of a layer of an electronic design in some embodiments. A region may also comprise a tessellated sub-area from a strip in some embodiments. A region may be automatically generated by various processes (e.g., tessellation processes) or manually, custom defined by user (e.g., using a pointing device to define a region). More details about the region obtained from tessellating a strip are described in U.S. patent application Ser. No. 13/931,627 entitled "METHODS, SYSTEMS, AND ARTICLES OF MANUFACTURE FOR ASSIGNING TRACK PATTERNS TO REGIONS OF AN ELECTRONIC DESIGN", the content of which is hereby expressly incorporated by reference in its entirety.

In some of these embodiments, the method may comprise the process 204 of implementing a circuit feature in the region. A circuit feature may comprise a shape, an interconnect, or a block of circuit elements such as an IP (Intellectual property) block, a macro, etc. In some of these embodiments, the method may comprise the process 206 of identifying a set of track patterns or track pattern groups. Process 206 may identify a track pattern from, for example, a track pattern repository or library in some embodiments. In some other embodiments, a track pattern may be provided or required by customers or manufacturers.

A track pattern comprises a collection of multiple tracks with one or more attributes including the start location of the track pattern, the number of repetitions of tracks in the track pattern, the layer on which the track pattern may reside, the orientation of the tracks, spacing between two adjacent tracks, or multi-patterning attribute(s) in some embodiments. A track may comprise a line of zero thickness on which the centerline of an interconnect lies. In some embodiments where a preferred or default routing direction is defined, a track along the preferred or default routing direction is called a right-way track. A track that does not lie along the preferred or default routing direction is called a wrong-way track in these embodiments.

A track pattern group comprises one or more track patterns, each of which has its own set of attributes such as including the start location of the track pattern, the number of repetitions of tracks in the track pattern, the layer on which the track pattern may reside, the orientation of the tracks, spacing between two adjacent tracks, or multi-patterning attribute(s) in some embodiments. A track pattern group may be formed by aggregating multiple track patterns. More details about track patterns and track pattern groups are described in the U.S. patent applications provided in ¶[0001] of the current application.

In some of these embodiments, the method may comprise the process 208 of identifying one or more track patterns or one or more track pattern groups that match the circuit feature. Process 208 may further associate with or assign to the region these matching track patterns or track pattern groups in some embodiments. As described above, a track pattern includes or is associated with a set of attributes and may be used to implement the physical design of an electronic design. A circuit feature also includes or corresponds to various attributes or characteristics. In addition, a circuit feature may be subject rules, constraints, or requirements (hereinafter "requirements" collectively).

For example, an interconnect may have a certain width and may be laid out in an electronic design with some spacing from an immediately neighboring interconnect. Process 208 thus determines whether the attributes associated with or included in track patterns match the corresponding attributes, characteristics, or requirements of a circuit feature. For example, if a first track pattern and a second track pattern are specified to include 1x-tracks for interconnects with 1x-width and 2x-tracks for interconnects with 2x-tracks respectively, and if an interconnect with 1x-width is to be implemented in an electronic design, process 208 may identify the first track pattern because its attribute (1x-tracks) matches the corresponding characteristic (1x-width interconnect) of the circuit feature.

In some of these embodiments, the method may comprise the process 210 of maintaining association or assignment of one or more track patterns or one or more track pattern groups for the region. It shall be noted that, unless otherwise specifically recited or claimed, the term assign and associate are used interchangeably in the context of assignment or association of track patterns or track patterns for an area or region. In some embodiments, process 210 maintains association or assignment of track patterns or track pattern groups for the region by modifying the ranking, score, or count of each of the identified one or more track patterns or track pattern groups that are determined to match the circuit feature.

For example, process 210 may maintain and track the accumulated total count for each track pattern in a region. Every time a particular track pattern is determined to match a circuit feature that is to be added to the region, process 210 may increment the count of the track pattern by one. Similarly, if the particular track pattern is determine to match the circuit feature that is to be removed from the region, process 210 may decrement the count of the track pattern by one. Process 210 may maintain the counts of all track patterns for a portion of the design or even the entire electronic design in a data structure such as a list or a database. Process 210 may also dynamically update such a data structure when the electronic design is being implemented so as to monitor the count, rank, or score of track patterns when circuit features are being added, removed, or modified.

Figure 3:
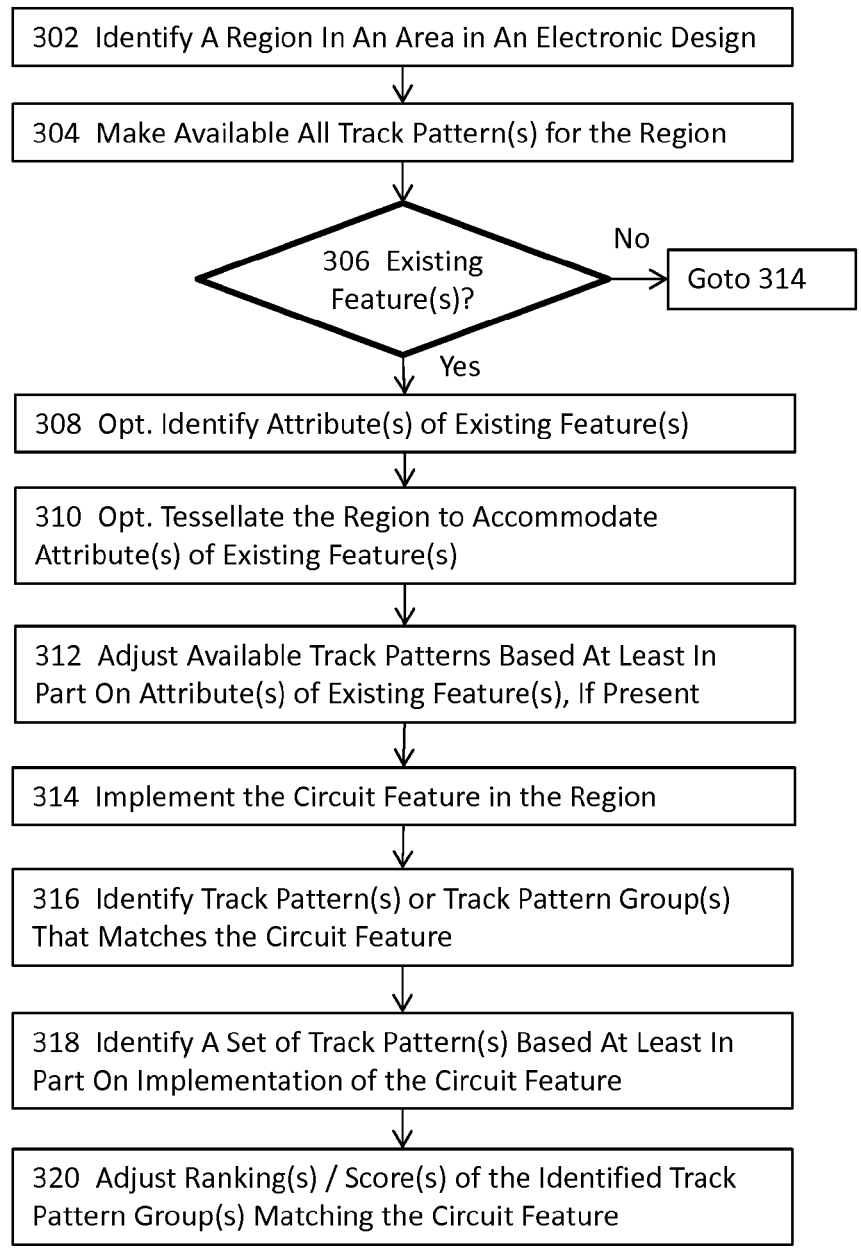
FIG. 3 illustrates a more detailed flow diagram for automatically assigning track patterns to regions for physical implementation of an electronic design in some embodiments.

FIG. 3 illustrates a more detailed flow diagram for automatically assigning track patterns to regions for physical implementation of an electronic design in some embodiments. In one or more embodiments, the method for automatically assigning track patterns to regions for physical implementation of an electronic design may comprise the process 302 of identifying a region in an area in an electronic design in substantially similar manners as that described for 202 of FIG. 2.

In some of these embodiments, the method may comprise the process 304 of making all track patterns or track pattern groups available for the region. Making all track patterns or track pattern groups available for the region decreases the possibility of error when a track pattern, which is not made available to the region, actually matches certain circuit features being added to the region. When the design implementation for a region in an electronic design first initiates, there is no existing circuit features in the region. Therefore, there is no limitation on the region, and thus no limitation on which track patterns or track pattern groups match may be associated with the region.

As the region is implemented, more circuit features will be added to the region, and these circuit features may require certain track patterns due to the attributes of these circuit features. Therefore, not all track patterns may be available to be assigned to the region. For example, an IP block may be added to the region during the floorplanning or placement stage, and the IP block may require certain interconnects with certain widths. Such a requirement of interconnect widths limit the availability of track patterns where track patterns with tracks associated with the same widths will be deemed compatible with the IP blocks and thus their rankings, scores, or counts will be incremented, while track patterns with different width attributes will be deemed incompatible. As another example, as interconnects of a specific width are added to the region, the specific width further limits what track patterns may be associated with the region, and track patterns with tracks associated with different widths will be deemed incompatible with the added interconnects and thus have lower rankings, scores, or counts than those track patterns having matching width attributes.

In some of these embodiments, the method may comprise the process 306 of determining whether or not there is an existing circuit feature in the region. In some embodiments where process 306 determines that there is at least one existing feature in the region, the method may proceed to 308. Otherwise, the method may proceed to 314. In some embodiments, an existing circuit feature comprises a circuit feature that is pre-existing in the region of interest before the initiation of implementation of the region and does not include circuit features that are added to the region during the implementation of the region.

In some of these embodiments, the method may optionally comprise the process 308 of identifying one or more attributes of the existing feature. The one or more attributes may comprise, for example but not limited to, width, coloring (for multiple-exposure lithography), spacing, location, orientation, relevant design requirements, etc. In some of these embodiments, the method may optionally comprise the process 310 of tessellating the region or area to accommodate these attributes of the existing feature identified at 308. For example, if an IP block having multiple width requirements in different parts of the IP block is found to exist in a region, process 310 may tessellate the region into multiple sub-regions such that each sub-region corresponds to a fewer number of width requirements (e.g., each sub-region corresponds to a single width requirement).

In some of these embodiments, the method may comprise the process 312 of adjusting or modifying the available track patterns based at least in part on the attribute of the existing feature, if present in the region of interest identified at 302. For example, process 312 may adjust the rankings, scores, or counts of track patterns with matching attributes so as to lower or eliminate the availability of certain track patterns that have been determined to fail to meet one or more of the identified attributes of an existing feature.

For example, if an existing feature requires interconnects with 1x-width, process 312 may associate the track patterns having 1x-tracks with the region to accommodate the existing circuit feature in some embodiments or may increment the counts of track patterns having 1x-tracks for the association with or assignment to the region. In some embodiments where a tessellation structure (e.g., a list or a database) is maintained to track the counts of track patterns for the implementation of wires or interconnects, the method may impose a requirement that the counts of the matching track patterns must equal the total number of wires or interconnects in a region. In some other embodiments, the above requirement may be relaxed so as not to require the counts of the matching track patterns must equal the total number of wires or interconnects in a region to permit a possibly illegal configuration in, for example, a rip-up and reroute process where possibly illegal configurations are allowed as the rip-up and reroute process proceeds.

In some of these embodiments, the method may comprise the process 314 of implementing a circuit feature in the region. For example, process 314 may perform floorplanning, placement, routing, post-route optimization process, or engineering change order (ECO) process to add, remove, or modify the first feature.

In some of these embodiments, the method may comprise the process 316 of identifying one or more track patterns or one or more track pattern groups that match the attributes of the first circuit feature. For example, when a wire of 1x-width is being added to the region, process 316 may identify all track patterns having 1x-tracks with zero or more tracks associated with other widths because the 1x-width attribute of the wire matches the 1x-width attribute associated with the 1x-tracks. It shall be noted that a track has zero width (or thickness) and is referenced to guide the router to lay the centerline of an interconnect along the track. Therefore, a 1x-track does not mean that the track physically has 1x-width; rather, a 1x-track means that such a track is to be used to implement interconnect of 1x-width. In addition, 1x-width indicates that a wire has one-unit width, and 2x-width indicates that a wire has two-unit width.

In some of these embodiments, the method may comprise the process 318 of identifying a set of track patterns or track pattern groups based at least in part on the implementation of the circuit feature. In the example given in the description of 316, process 318 may then identify the track patterns having tracks that allow the implementation of the interconnect with 1x-width.

In some of these embodiments, the method may comprise the process 320 of adjusting or modifying the rankings, scores, or counts of the identified track patterns or track pattern groups that have been determined to match certain attributes of the circuit feature been implemented. Depending on how the circuit is implemented, process 320 may adjust the rankings, scores, or counts of the matching track patterns accordingly. For example, when the circuit feature is added to the region of interest, process 320 may increment the counts, rankings, or scores of matching track patterns. On the other hand, when the circuit feature is removed from the region of interest, process 320 may decrement the counts, rankings, or scores of matching track patterns. In addition, when the circuit feature is neither added nor removed but is modified in the region, process 320 adjusts the counts, scores, or rankings of matching track patterns based on how the circuit feature is modified, and how the modification of the circuit feature affects the determination of whether a track pattern matches the circuit feature.

Figure 4A:
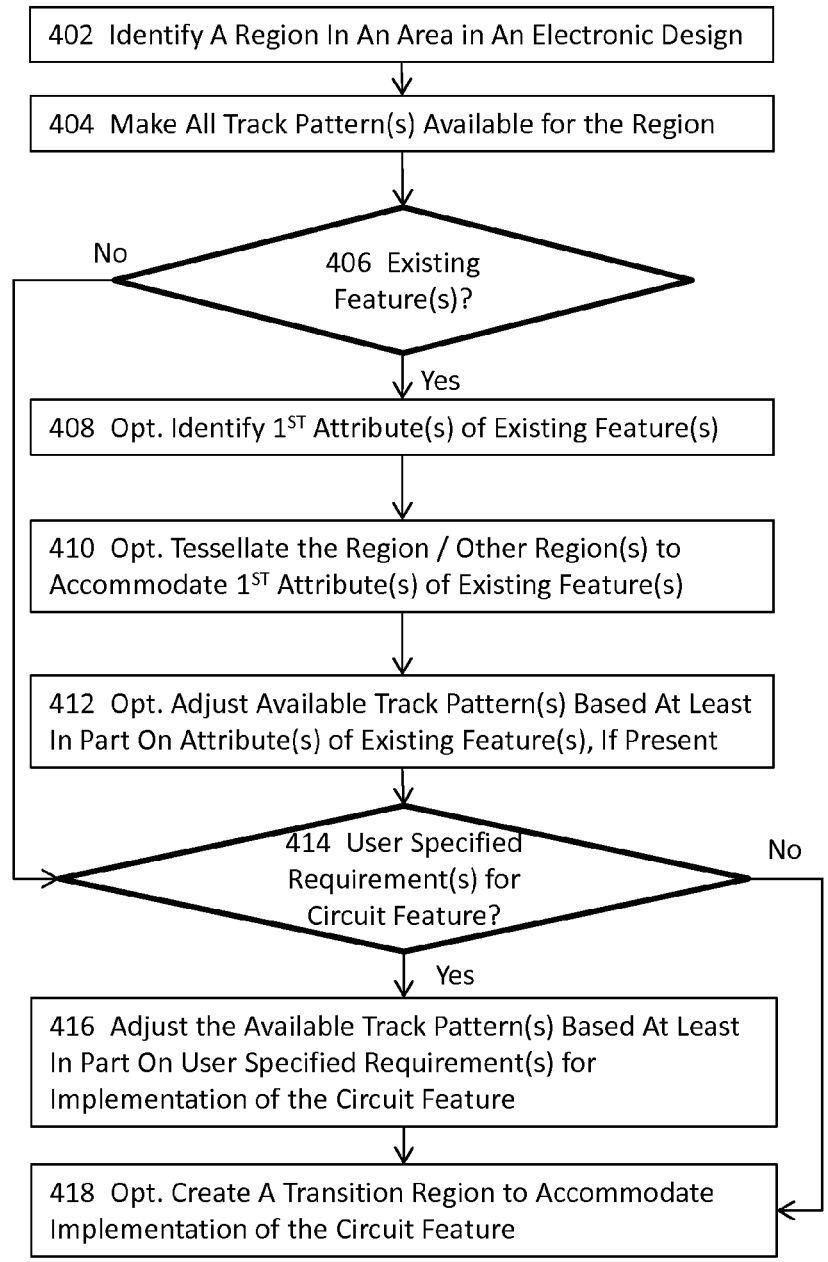
FIGS. 4A-4B jointly illustrate a more detailed flow diagram for automatically assigning track patterns to regions for physical implementation of an electronic design in some embodiments.
Figure 4B:
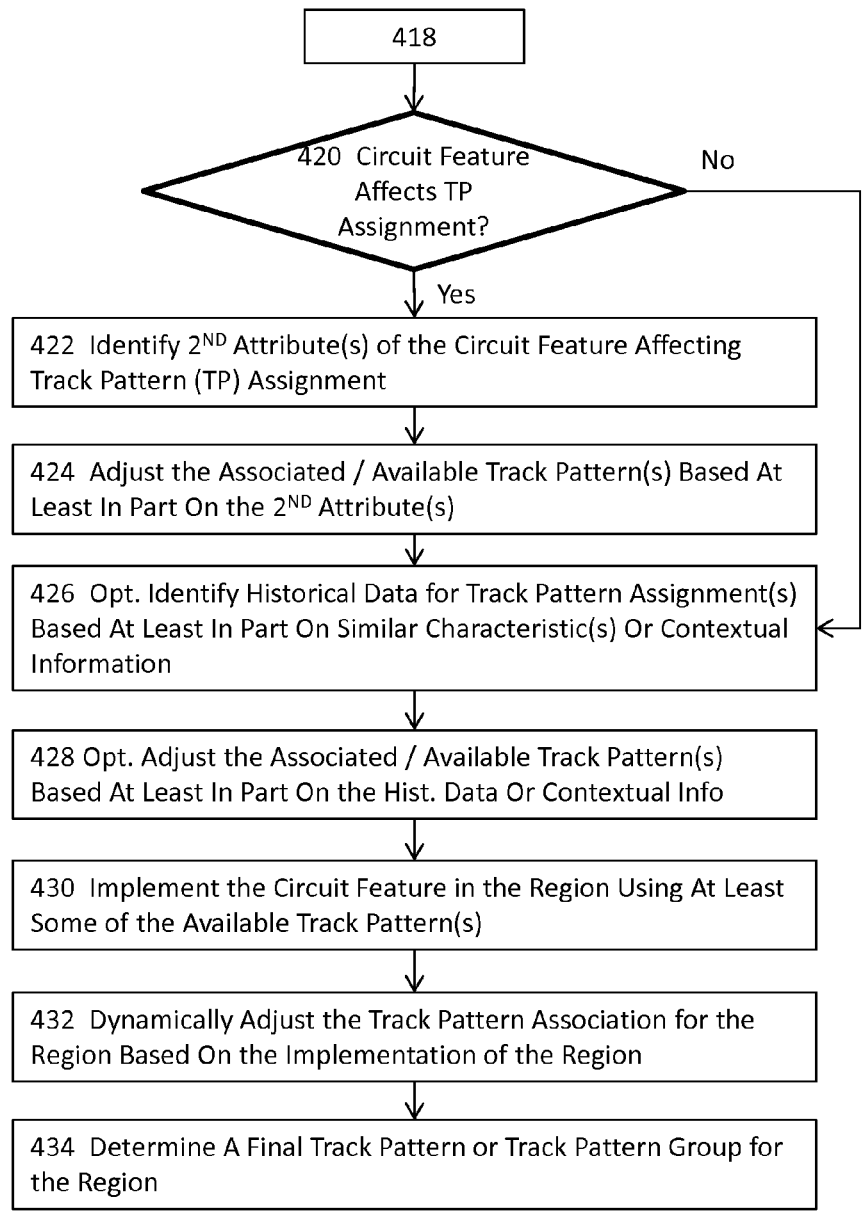

FIGS. 4A-B jointly illustrate a more detailed flow diagram for automatically assigning track patterns to regions for physical implementation of an electronic design in some embodiments. In one or more embodiments, the method for automatically assigning track patterns to regions for physical implementation of an electronic design may comprise the process 402 of identifying a region in an area in an electronic design in substantially similar manners as that described for 202 of FIG. 2 or 302 of FIG. 3. In some of these embodiments, the method may comprise the process 404 of making all track patterns available for the region. Making all track patterns or track pattern groups available for the region decreases the possibility of error when a track pattern, which is not made available to the region, actually matches certain circuit features being added to the region. Process 404 may be performed in substantially similar manners as that described for 304 of FIG. 3.

In some of these embodiments, the method may comprise the process 406 of determining whether or not there is an existing circuit feature in the region. In some embodiments where process 306 determines that there is at least one existing feature in the region, the method may proceed to 408. Otherwise, the method may proceed to 414. In some embodiments, an existing circuit feature comprises a circuit feature that is pre-existing in the region of interest before the initiation of implementation of the region and does not include circuit features that are added to the region during the implementation of the region.

In some of these embodiments, the method may comprise the process 408 of identifying one or more first attributes of the existing feature. The one or more first attributes may comprise, for example but not limited to, width, coloring (for multiple-exposure lithography), spacing, location, orientation, relevant design requirements, etc. In some of these embodiments, the method may optionally comprise the process 410 of tessellating the region or area to accommodate the one or more first attributes of the existing feature identified at 408. Process 410 may be performed in a substantially similar manner as that described for 310 of FIG. 3.

In some of these embodiments, the method may comprise the process 412 of adjusting or modifying the available track patterns based at least in part on the attribute of the existing feature, if present in the region of interest identified at 402. Process 412 may be performed in a substantially similar manner as that described for 312 of FIG. 3. In some of these embodiments, the method may comprise the process 414 of determining whether or not there is a user-specified requirement for the circuit feature that is to be implemented (e.g., added, removed, or modified) in the region of interest. In some embodiments where process 414 determines that there is a user-specified requirement for the circuit feature, the method proceeds to 416. Otherwise, the method proceeds to 418. A user-specified requirement may include, for example but not limited to, a requirement that the circuit feature be implemented with a specific arrangement of tracks and a specific width in some embodiments. Such a user-specified requirement may come from, for example, a customer or a manufacturer.

In some of these embodiments, the method may comprise the process 416 of adjusting the available track patterns based at least in part on the user-specified requirement for the implementation of the circuit feature. In the above example where a user-specified requirement specifically requires the circuit feature (e.g., a wire) be implemented with a specific width (e.g., 1x-width), process 412 may increment the count, rankings, or scores of the matching track patterns or decrement the counts, rankings, or scores of the mismatching track patterns. Process 412 may be performed in a substantially similar manner as that described for 312 of FIG. 3.

In some of these embodiments, the method may optionally comprise the process 418 of creating a transition region to accommodate the implementation of the circuit feature in the region of interest. For example, process 316 may identify a free area to create a transition area that is to be associated with one or more track patterns to accommodate the implementation of the circuit feature in the region. In this example, if the circuit feature comprises a continuation of an interconnect having a 2x-width from an immediately neighboring region, and the interconnect is to have 1x-width in the current region of interest, process 418 may create a transition region between the current region and the immediately neighboring region to accommodate the different width requirements between the current region and the immediately neighboring region.

In some of these embodiments, the method may comprise the process 420 of determining whether or not the existing feature identified at 406 affects the assignment or association or generally the availability of track patterns or track pattern groups. In some embodiments where process 420 determines that the existing circuit feature affects the assignment, association, or availability of track patterns or track pattern groups, the method may proceed to 422. Otherwise, the method may proceed to 426.

In some of these embodiments, the method may comprise the process 422 of identifying one or more second attributes of or related to the existing circuit feature that affect the association, assignment, or availability of track patterns or track pattern groups. In these embodiments where there is an existing circuit feature in the region, the available track patterns or track pattern groups must conform to the requirements of the existing circuit feature, or there will be violations. The one or more second attributes may include, for example, width requirement(s), spacing requirement(s), start location(s), orientation, multi-patterning requirement(s), or relevant design requirement(s) (e.g., design rules, etc.), etc.

In some of these embodiments, the method may comprise the process 424 of adjusting the associated or available track patterns or track pattern groups based at least in part on the one or more second attributes identified at 422. For example, process 422 may increment the counts, rankings, or scores of matching track patterns or decrement the counts, rankings, or scores of mismatching track patterns with respect to the one or more second attributes. In some of these embodiments, the method may optionally comprise the process 426 of identifying historical data for track pattern assignments or associations based at least in part on one or more similar characteristics of the current electronic design or region under consideration. In addition or in the alternative, process 426 may further consider the context in which the region is situated in identifying the historical data from electronic designs that exhibit similar regions in a similar context as the current region of interest.

In some of these embodiments, the method may optionally comprise the process 428 of adjusting the associated or available track patterns based at least in part on the historical data or contextual information identified at 426. For example, process 428 may determine that other electronic designs in a similar context have certain association or assignment of track patterns for similarly situated regions. Process 428 may then adjust the rankings, counts, or scores of available or associated track patterns for the region accordingly. In some of these embodiments, the method may comprise the process 430 of implementing the circuit feature in the region using one or more tracks in at least some of the available track patterns or track pattern groups. More details about implementing an electronic design using tracks in track patterns are described in the U.S. patent applications provided in ¶[0001] of the current application.

In some of these embodiments, the method may comprise the process 432 of dynamically adjusting or maintaining the track pattern association or assignment for the region based at least in part on the implementation of the region in the electronic design. For example, when a circuit feature is added, removed, or modified inside the region, one or more attributes of the circuit feature may further limit the availability of certain track patterns or may enhance the availability of certain other track patterns. Process 432 may thus update the track pattern association or assignment by using, for example, a tessellation structure during the implementation of the region in an electronic design.

In some of these embodiments, the method may comprise the process 434 of determining a final track pattern or track pattern group for the region. In the approach illustrated in FIGS. 4A-B, the method starts with a "tentative" list of track patterns for implementing a region. As the implementation proceeds, the "tentative" list of track patterns may be reduced to one or a few track patterns. If the list of track patterns is finally reduced to one track pattern or one track pattern group, and the implementation can be successfully completed, the method may stop. If there are competing track patterns (e.g., two track patterns having close or even identical counts, scores, or rankings), the method may keep all competing track patterns in some embodiments. In some other embodiments, process 434 may identify one track pattern from the competing track patterns based on some criteria. Generally, track patterns having 1x-tracks provide more tracks, while track patterns having 1x-tracks and 2x-tracks (e.g., aggregated track patterns having the same track pattern group name to group both the 1x-tracks and the 2x-tracks such as the ones shown in FIGS. 8A-B) provide greater flexibility because such track patterns may accommodate both the wires with 1x-width and the wires with 2x-width.

Figure 5:
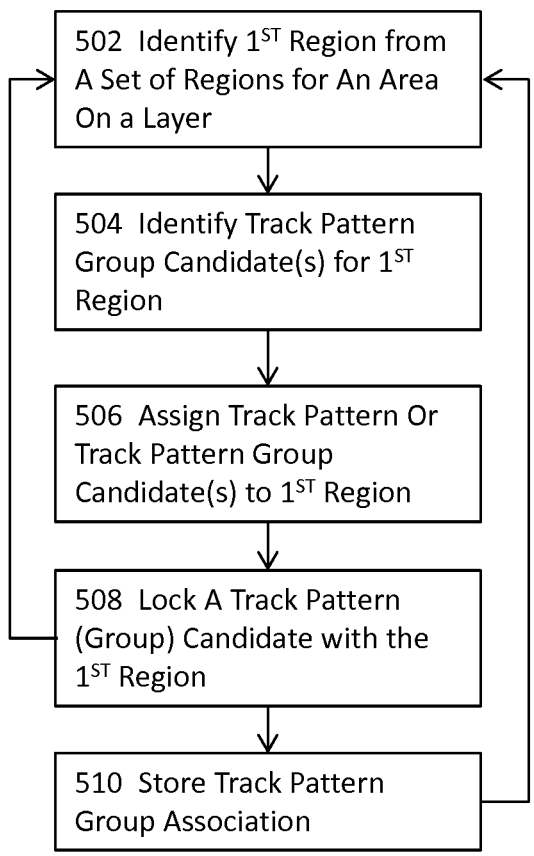
FIG. 5 illustrates a high level flow diagram for automatically assigning track patterns to regions for physical implementation of an electronic design in some embodiments.

FIG. 5 illustrates a high level flow diagram for automatically assigning track patterns to regions for physical implementation of an electronic design in some embodiments. In one or more embodiments, the method for automatically assigning track patterns to regions for physical implementation of an electronic design may comprise the process 502 of identifying a first region from a set of regions for an area on a layer in substantially similar manners as that described for 202 of FIG. 2, 302 of FIG. 3, or 402 of FIGS. 4A-B.

In some of these embodiments, the method may comprise the process 504 of identifying one or more track pattern candidates or one or more track pattern group candidates for the first region. For example, process 504 may identify all track patterns or track pattern groups for a region that includes no existing circuit features when the implementation of the region is first initiated. Process 504 may also identify track pattern candidates or track pattern group candidates based at least in part on one or more existing circuit features in the region in some embodiments. Process 504 may also identify track pattern candidates or track pattern group candidates based at least in part on one or more adjacent areas that are within some proximity of the current region of interest.

For example, an adjacent region may be electrically connected to the current region. Therefore, the connectivity requirement from the adjacent region may thus affect the implementation and thus the track pattern assignment of the current region. Process 504 may also identify track pattern candidates or track pattern group candidates based at least in part on one or more adjacent layers of the layer on which the current region of interest resides. For example, an interconnect in the current region on a layer may jump to an adjacent layer to continue its routing and may further return to the current layer to complete the routing. Therefore, whether the region in the adjacent layer is properly configured to have the proper track pattern(s) or track pattern group(s) with sufficient overlap with the current region of interest may also affect the assignment or association of track pattern(s) or track pattern group(s) for the current region.

In some of these embodiments, the method may comprise the process 506 of assigning the one or more track pattern candidates or one or more track pattern group candidates to the region. When a track pattern is assigned to or associated with a region, interconnects in the region may only be implemented with the tracks in the track pattern. Consequently, after process 506 assigns the one or more track pattern candidates or one or more track pattern group candidates to the region, the implementation of interconnects in the region is limited to the tracks in the one or more track pattern candidates or one or more track pattern group candidates. In some embodiments, process 506 assigns track pattern(s) or track pattern group(s) to a region by using a set_layer_constraint to map the track pattern(s) or track pattern group(s) to the region. More details about assignment or association of track patterns or track pattern groups for a region are described in the U.S. patent applications provided in ¶[0001] of the current application.

In some of these embodiments, the method may comprise the process 508 of locking a single track pattern or track pattern group candidate with the first region. Process 508 may be performed in a substantially similar manner as that described for 434 of FIGS. 4A-B. In some of these embodiments, the method may comprise the process 510 of storing track pattern group association or assignment for the region. In some embodiments, process 510 may store the track pattern group association in a tessellation structure which includes information about the tessellated strips or tessellated regions together with their respective association or assignment of track pattern(s) or track pattern group(s). More details about storing the track pattern or track pattern group association or assignment are described in the U.S. patent applications provided in the section entitled "CROSS-REFERENCE TO RELATED APPLICATION(S)" of the current application.

Figure 6:
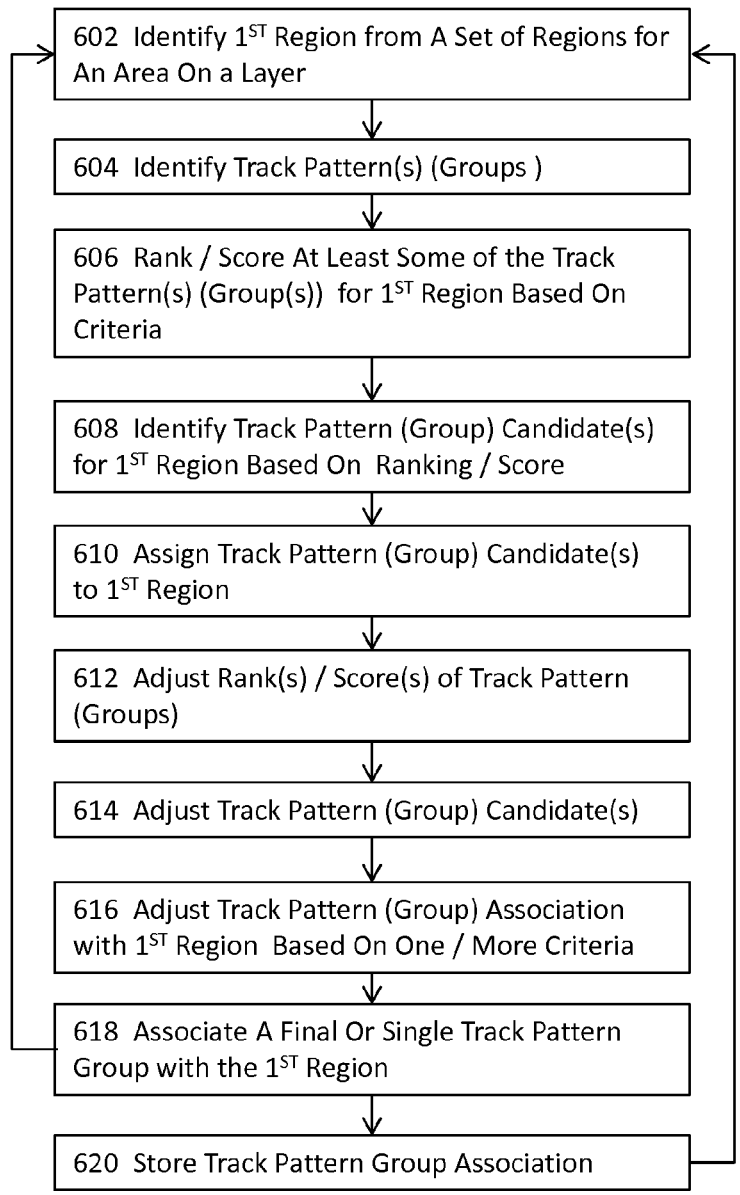
FIG. 6 illustrates a more detailed flow diagram for automatically assigning track patterns to regions for physical implementation of an electronic design in some embodiments.

FIG. 6 illustrates a more detailed flow diagram for automatically assigning track patterns to regions for physical implementation of an electronic design in some embodiments. In one or more embodiments, the method for automatically assigning track patterns to regions for physical implementation of an electronic design may comprise the process 602 of identifying a first region from a set of regions for an area on a layer. Process 602 may be performed in substantially similar manners as those described for 202, 302, 402, or 502 of FIGS. 2-5, respectively.

In some of these embodiments, the method may comprise the process 604 of identifying one or more track patterns or one or more track pattern groups. Process 604 may be performed in substantially similar manners as those described for 206 or 504 of FIGS. 2 and 5, respectively.

In some of these embodiments, the method may comprise the process 606 of ranking or scoring at least some of the identified one or more track patterns or one or more track pattern groups for the first region based on one or more criteria. The one or more criteria may include, for example, one or more existing circuit features in the first region, one or more existing circuit features in one or more adjacent regions on the current layer or on one or more adjacent layers, connectivity of the first region or of one or more other regions electrically connected to the first region, assignment or association of track pattern(s) or track pattern group(s) of one or more other regions on the current layer or on one or more adjacent layers, or one or more circuit features being added to or removed from the first region due to the implementation of the first region, etc. Process 606 may thus increment the respective counts, rankings, or scores for track patterns or track pattern groups that match one or more of the criteria or decrement the respective counts, rankings, or scores for track patterns or track pattern groups that do not match at least one of the one or more criteria.

In some of these embodiments, the method may comprise the process 608 of identifying one or more track pattern or track pattern group candidates for the first region based at least in part on the rankings, scores, or counts of the one or more track patterns or track pattern groups identified at 604. In some of these embodiments, the method may comprise the process 610 of assigning one or more track pattern or track pattern group candidates to the first region. Process 610 may be performed in substantially similar manners as those described for 506 of FIG. 5.

In some of these embodiments, the method may comprise the process 612 of adjusting the respective counts, rankings, or scores of track patterns or track pattern group candidates in substantially similar manners as those described for 412, 416, 420, 422, 424, 426, 428, or 432 of FIGS. 4A-B, 312 or 320 of FIG. 3, or 210 of FIG. 2. In some of these embodiments, the method may comprise the process 614 of adjusting or modifying one or more candidates of the track pattern or track pattern group candidates, if such one or more candidates may be modified. A track pattern or track pattern group provided by the customer or the manufacturer may be one that cannot be modified.

For example, process 614 may modify a track pattern or a track pattern group to add one or more tracks or track patterns or to remove one or more tracks or track patterns in the group to custom fit what is required by an implementation of a particular wire. In these embodiments, process 614 may rename the track pattern or track pattern group that it modifies and add it to the list or data structure (e.g., a tessellation structure) storing all the track patterns or track pattern groups for assignment or association. This renaming may be done to reduce the impact on current assignment or association of the original track pattern for other regions.

In some of these embodiments, the method may comprise the process 616 of adjusting the track pattern or track pattern group association with or assignment to the first region based at least in part on one or more criteria. The one or more criteria may include, for example, one or more of those described in 408, 412, 414, 422, 426, or 432 of FIGS. 4A-B, or 308 of FIG. 3. In some of these embodiments, the method may comprise the process 618 of associating a final or single track pattern or track pattern group with the first region. Process 618 may be performed in a substantially similar manner as those described for 508 of FIG. 5 or 434 of FIGS. 4A-B.

In some of these embodiments, the method may comprise the process 620 of storing the association or assignment of track pattern(s) or track pattern group(s) in a substantially similar manner as that described for 510 of FIG. 5.

Figure 7:
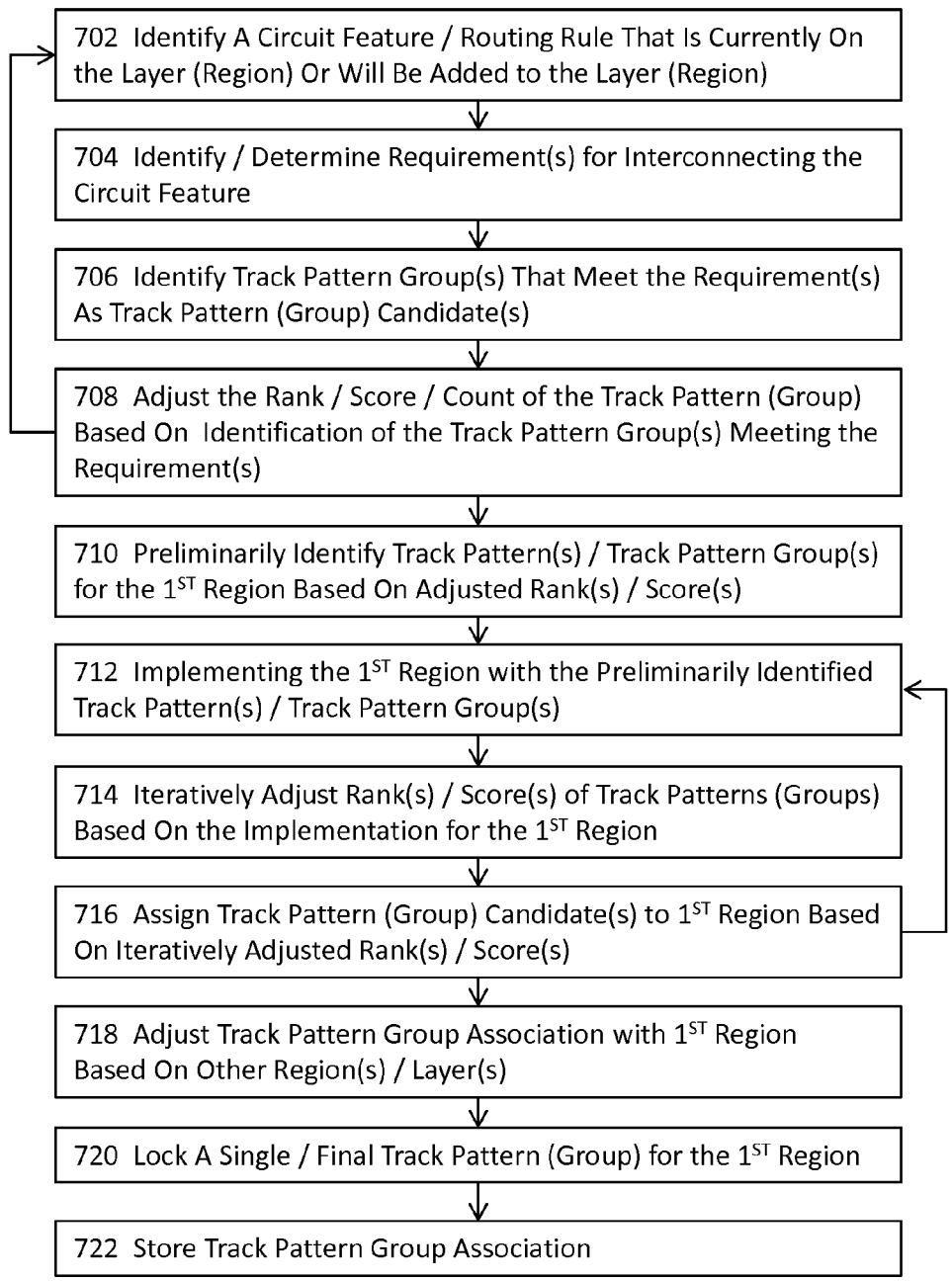
FIG. 7 illustrates a more detailed flow diagram for automatically assigning track patterns to regions for physical implementation of an electronic design in some embodiments.

FIG. 7 illustrates a more detailed flow diagram for automatically assigning track patterns to regions for physical implementation of an electronic design in some embodiments. In one or more embodiments, the method for automatically assigning track patterns to regions for physical implementation of an electronic design may comprise the process 702 of identifying a circuit feature or a routing rule. The circuit feature may be currently on the layer of interest or currently in the region of interest on the layer in some embodiments. The circuit feature may be one that is to be added to the layer of interest or to the region of interest on the layer in some other embodiments. Similarly, the routing rule may be currently associated with the layer of interest or with a region on the layer in some embodiments or will be associated with the layer of interest or with a region on the layer in some other embodiments.

In some of these embodiments, the method may comprise the process 704 of identifying or determining one or more requirements for interconnecting the circuit feature. The one or more requirements may include, for example, one or more of those described in 406, 408, 412, 414, 420, 422, 426, or 432 of FIGS. 4A-B, or 308 of FIG. 3. In some of these embodiments, the method may comprise the process 706 of identifying one or more track patterns or track pattern groups that meet the one or more requirements as one or more track pattern or track pattern group candidates. Process 706 may be performed in a substantially similar manner as that described for 208 of FIG. 2, 316 of FIG. 3, 406, 408, 412, 414, 420, 422, 426, or 432 of FIGS. 4A-B, or 504 of FIG. 5.

In some of these embodiments, the method may comprise the process 708 of adjusting the respective counts, rankings, or scores of the one or more track pattern candidates or one or more track pattern group candidates based at least in part upon on the identification of the one or more track patterns or track pattern groups that meet the one or more requirements identified at 704. Process 704 may be performed in a substantially similar manner as that described for 210 of FIG. 2, 320 of FIG. 3, 416 of FIG. 4, or 612 of FIG. 6. In some of these embodiments, the method may comprise the process 710 of preliminarily or tentatively identifying one or more track patterns or one or more track pattern groups for the first region based at least in part on the rankings, scores, or counts adjusted at 708. In some embodiments, the preliminarily or tentatively identified one or more track patterns or one or more track pattern groups may be maintained in a data structure such as a tessellation structure in a volatile memory of a computing system.

In some of these embodiments, the method may comprise the process 712 of implementing the first region with the preliminarily or tentatively identified one or more track patterns or track pattern groups. For example, process 712 may choose the appropriate one or more tracks in the "live" track patterns or track pattern groups to implement an interconnect. A live track pattern or track pattern group is one that includes tracks meeting the requirements of the circuit feature being implemented.

In some of these embodiments, the method may comprise the process 714 of iteratively or dynamically adjusting the rankings, scores, or counts of the one or more track patterns or one or more track pattern groups based at least in part on the implementation for the first region. Because circuit features are often implemented one at a time for each task even in a parallel or distributed computing environment (e.g., each computing node routes one interconnect at a time), the preliminarily or tentatively identified one or more track patterns or one or more track pattern groups are thus iteratively and dynamically maintained or adjusted as the implementation of the electronic design proceeds.

In some of these embodiments, the method may comprise the process 716 of assigning at least some of the preliminarily or tentatively identified one or more track patterns or one or more track pattern groups to the first region based at least in part on the iteratively or dynamically adjusted rankings, scores, or counts. More details about assigning a track pattern or a track pattern group to a region are described in the U.S. patent applications provided in ¶[0001] of the current application.

In some of these embodiments, the method may comprise the process 718 of adjusting the assignment or association of track pattern(s) or track pattern group(s) for the first region based at least in part on one or more requirements of one or more other regions or one or more other layers. Process 718 may be performed in a substantially similar manner as that described for 504 of FIG. 5 or 606 of FIG. 6.

In some of these embodiments, the method may comprise the process 720 of locking a single or a final track pattern or track pattern group for the first region. Process 718 may be performed in a substantially similar manner as that described for 434 of FIGS. 4A-B, 508 of FIG. 5, or 618 of FIG. 6. In some of these embodiments, the method may comprise the process 722 of storing the association or assignment of track pattern(s) or track pattern group(s) for the region in substantially similar manners as those described for 620 of FIG. 6 or 510 of FIG. 5.

FIGS. 8A-B illustrate some exemplary command syntax for in some embodiments. 800 illustrates an exemplary command for setting track patterns with the following syntax:

Set_track_pattern-start<start>-repeat<repeat>-x<bool>-spacing<value>-name "<name>"-layer<layer>-constraint_group "<rule>"-pattern_group_name "<pattern group name"

With the exemplary syntax shown in 800, the method disclosed herein may specify or declare the first track pattern 802 as follows:

Set_track_pattern-start s1-repeat 10000-x false-spacing val1-name "1xTrack1"-layer M2-constraint_group "onex-rule"-pattern_group_name "1x"

With the exemplary syntax shown in 800, the method disclosed herein may specify or declare the second track pattern 804 as follows:

Set_track_pattern-start s2-repeat 10000-x false-spacing val2-name "1xTrack2"-layer M2-constraint_group "onex-rule"-pattern_group_name "1x+2x"

With the exemplary syntax shown in 800, the method disclosed herein may specify or declare the second track pattern 806 as follows:

Set_track_pattern-start s3-repeat 10000-x false-spacing val3-name "2xTrack1"-layer M2-constraint_group "twox-rule"-pattern_group_name "1x+2x"

With the above three exemplary track patterns, the method may update the rule specification to permit electronic design implementation tool to use either 1xTrack1 or 1x Track 2 by incorporating the following in the rule specification as show in 808:

M2 trackPattern constraint "1xTrack1+1xTrack2"

More details about the above commands and the various attributes and values are described in the U.S. patent applications provided in ¶[0001] of the current application.

The method may also use the following exemplary command with exemplary syntax shown in 822 of FIG. 8B as follows to construct a tessellation structure:

set_tessellation_pattern-x false-start<start>-spacing<spacing>-repeat<repeat>-layer<layer>

The method may also use the following exemplary command with exemplary syntax shown in 824 of FIG. 8B as follows to label a region of tessellation:

Label_tessellation-region {xlo ylo xhi yhi}-name "track_pattern_name"-layer<layer>

Figure 9A:
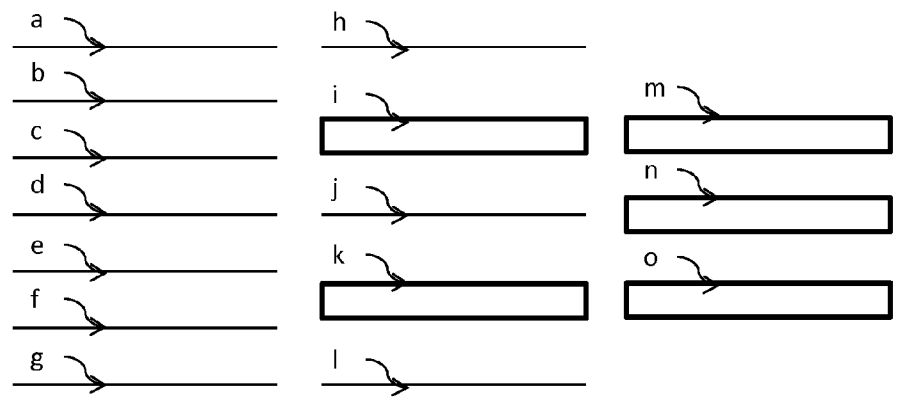
FIGS. 9A-D illustrates an example of the application of the process for automatically assigning track patterns to regions for physical implementation of an electronic design in some embodiments.

FIGS. 9A-D illustrates an example of the application of the process for automatically assigning track patterns to regions for physical implementation of an electronic design in some embodiments. More specifically, FIG. 9A shows that three track patterns where the left track pattern (the first track pattern) has seven 1x-tracks (a, b, c, d, e, f, g); the middle track pattern group (the second track pattern group) includes two aggregated track patterns and has three 1x-tracks (h, j, l) and two 2x-tracks (l, k); and the right track pattern (the third track pattern) has three 2x-tracks (m, n, o).

Figure 9B:
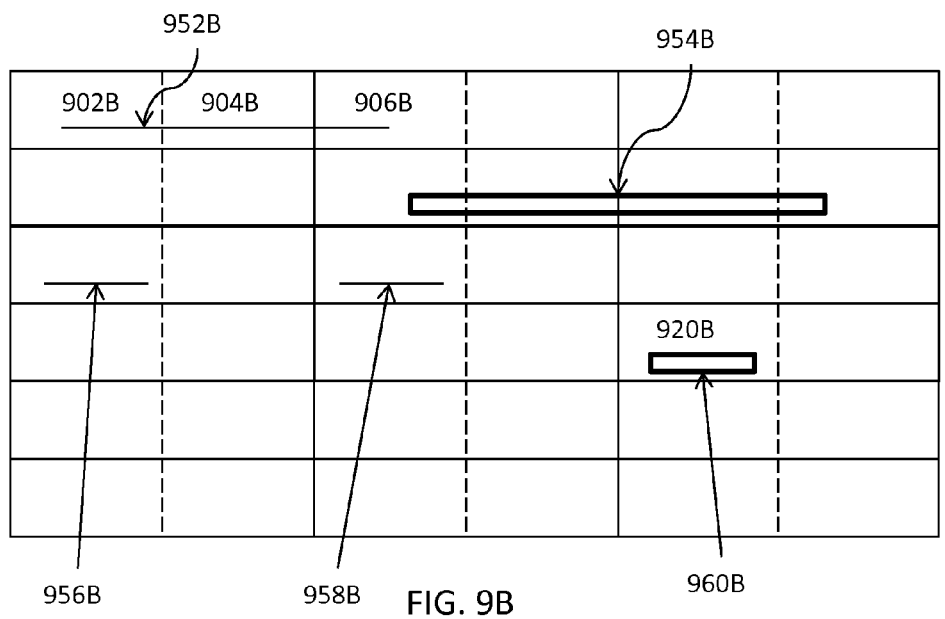

For the purpose of illustration and explanation, track a is aligned with h and may be denoted as (a, h). Other aligned tracks include (d, j), (g, l), (i, m), and (k, o). FIG. 9B illustrates a tessellation pattern having six strips in the first (horizontal) direction. For example, the tessellation engine may insert a strip line, which divides two adjacent strips, on a power rail having a horizontal orientation in some embodiments. FIG. 9B further illustrates that each strip is further tessellated into six regions in the second (vertical) direction. The method described herein may associate track patterns or track pattern groups with each of the 36 regions illustrated in FIG. 9B. When the implementation process for the entire area is first initiated so that there is no existing circuit features, the method may associate all track patterns or track pattern groups to each of the 36 regions. Therefore, each of the 36 regions may be labeled as, for example, "any" indicating that any track patterns or track pattern groups may be used to implement the region.

FIG. 9B includes five wires—952B, 954B, 956B, 958B, and 960B. Suppose wire 952B is on track (d, j), wire 954B on (i, m), wire 956B on (g, l), wire 958B on track (g, l), and wire 960B on track (o). As described herein, the method may limit the assignment or association of track patterns by matching the attributes of the implemented wires with the corresponding attributes of the available track patterns. For example, regions 902B, 904B, and 906B are limited to the first track pattern and the second track pattern group because the tracks (d, j) belong to the first track pattern and the second track pattern group. Similarly, the method may limit region 920B to the third track pattern because the track (m) belongs to the third track pattern. The method may dynamically or iteratively determine these region assignments or associations by adding, removing, or modifying a wire. The method may also determine whether a particular wire may be legally assigned to the tessellation.

Figure 9C:
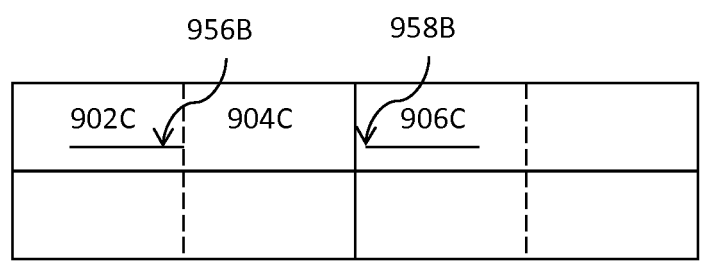
Figure 9D:
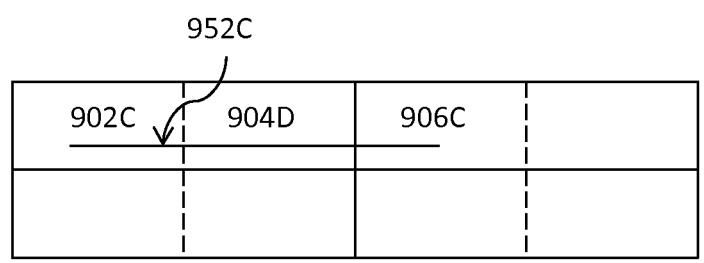

FIG. 9C shows three regions with a proposed wire 952C occupying track (g, l). In this example, the method may limit regions 902C, 904C, and 906C to the first track pattern and the second track pattern group due to the implementation of the wire 952C because the track (g, l) belongs to both the first track pattern and the second track pattern group, and further because the track (d, j) crosses all three regions 902C, 904C, and 906C. Suppose wire 952C in FIG. 9D is obtained by connecting 956B and 958B in FIG. 9B.

It shall be noted that before completing the connection of 958B and 956B as shown in FIG. 9C, both regions 902C and 906C are associated with the first track pattern and the second track pattern group because the track (g, l) belong to the first track pattern and the second track pattern group. Before the connection between 956B and 958B is completed, region 904C is associated with "any" track patterns or track pattern groups because of the absence of any circuit features in this region 904C. FIG. 9D illustrates the completed connection of wire 956B and 958B to form wire 952C. Because now wire 952C crosses all three regions 902C, 904D, and 906C, the region 904D is now associated with the first track pattern and the second track pattern group.

If wire 952C or any of the wires shown in FIG. 9B is removed, the removal of a wire may enable one or more track patterns due to the relaxation of some requirements imposed by the removed wire. Some embodiments may keep track of the lists of assignments or associations by using a collection of counts for the track patterns or track pattern groups in, for example, a tessellation structure. For example, the tessellation may maintain a count for the number of wires in a region, and a count for each pattern group. Moreover, a pattern group may be deemed legal if its count equals the number of wires in the region.

System Architecture Overview

Figure 10:
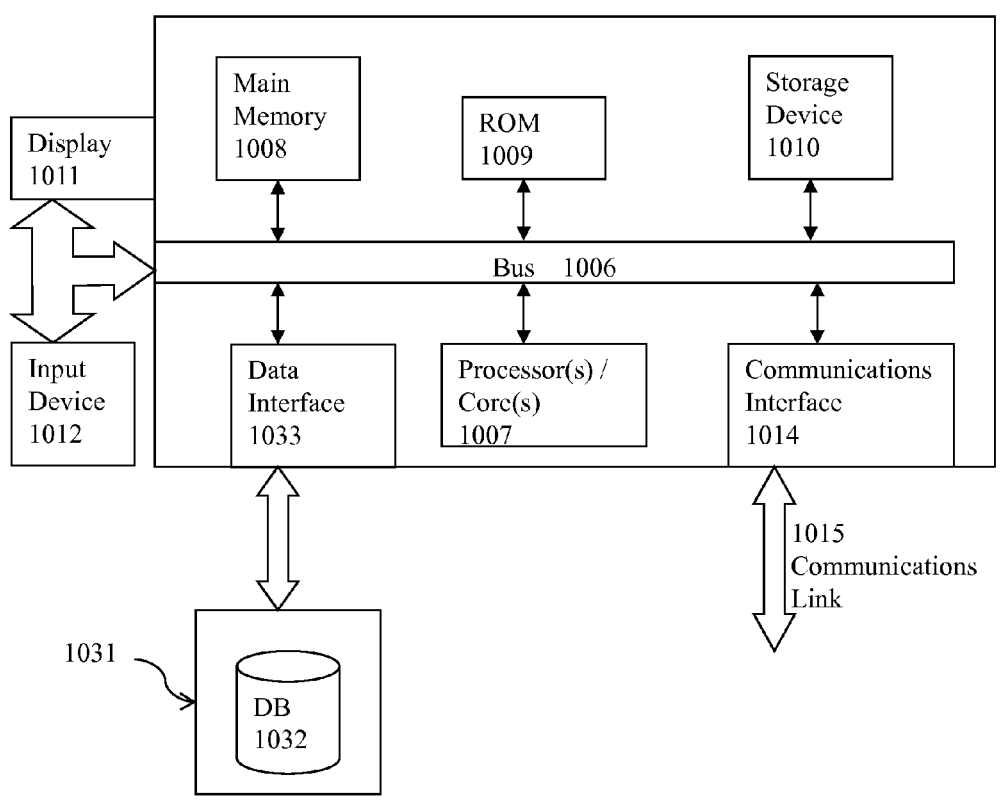
FIG. 10 illustrates a computerized system on which a method for a more detailed flow diagram for implementing a physical electronic design with area-bounded tracks in some embodiments may be implemented.

FIG. 10 illustrates a block diagram of an illustrative computing system 1000 suitable for implementing a physical electronic design with area-bounded tracks as described in the preceding paragraphs with reference to various figures. Computer system 1000 includes a bus 1006 or other communication mechanism for communicating information, which interconnects subsystems and devices, such as processor 1007, system memory 1008 (e.g., RAM), static storage device 1009 (e.g., ROM), disk drive 1010 (e.g., magnetic or optical), communication interface 1014 (e.g., modem or Ethernet card), display 1011 (e.g., CRT or LCD), input device 1012 (e.g., keyboard), and cursor control (not shown).

According to one embodiment, computer system 1000 performs specific operations by one or more processor or processor cores 1007 executing one or more sequences of one or more instructions contained in system memory 1008. Such instructions may be read into system memory 1008 from another computer readable/usable storage medium, such as static storage device 1009 or disk drive 1010. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 1007, where the one or more processors, one or more processor cores, or combination thereof executes one or more threads. For example, the act of specifying various net or terminal sets or the act or module of performing verification or simulation, etc. may be performed by one or more processors, one or more processor cores, or combination thereof. In one embodiment, the parasitic extraction, current solving, current density computation and current or current density verification is done in memory as layout objects or nets are created or modified.

The term "computer readable storage medium" or "computer usable storage medium" as used herein refers to any medium that participates in providing instructions to processor 1007 for execution. Such a medium may take many forms, including but not limited to, non-volatile media and volatile media. Non-volatile media includes, for example, optical or magnetic disks, such as disk drive 1010. Volatile media includes dynamic memory, such as system memory 1008.

Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1000. According to other embodiments of the invention, two or more computer systems 1000 coupled by communication link 1015 (e.g., LAN, PTSN, or wireless network) may perform the sequence of instructions required to practice the invention in coordination with one another.

Computer system 1000 may transmit and receive messages, data, and instructions, including program, i.e., application code, through communication link 1015 and communication interface 1014. Received program code may be executed by processor 1007 as it is received, and/or stored in disk drive 1010, or other non-volatile storage for later execution. In an embodiment, the computer system 1000 operates in conjunction with a data storage system 1031, e.g., a data storage system 1031 that contains a database 1032 that is readily accessible by the computer system 1000. The computer system 1000 communicates with the data storage system 1031 through a data interface 1033. A data interface 1033, which is coupled to the bus 1006, transmits and receives electrical, electromagnetic or optical signals that include data streams representing various types of signal information, e.g., instructions, messages and data. In embodiments of the invention, the functions of the data interface 1033 may be performed by the communication interface 1014.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

I claim:

1. A computer implemented method for automatically assigning track patterns to regions for physical implementation of an electronic design, comprising:
   using a computing system having at least one processor or at least one processor core to perform a process, the process comprising:
   identifying a set of one or more track patterns that match a circuit feature in an area of an electronic design, wherein a track pattern in the set includes multiple tracks, each of which has zero width and is used for implementing the area of the electronic design;
   implementing the circuit feature in the area of the electronic design by using one or more tracks identified from at least a part of the set of track patterns; and
   updating assignment of one or more track patterns to the area.

2. The computer implemented method of claim 1, wherein the act of updating the assignment is based at least in part upon a result of implementing multiple circuit features in the area in an dynamic or iterative manner.

3. The computer implemented method of claim 1, the process further comprising:
   making all track patterns available for the region; and
   determining whether or not one or more attributes of a track pattern in the all track patterns match one or more corresponding attributes of the circuit feature to be implemented in the area.

4. The computer implemented method of claim 1, the process further comprising at least one of:
   determining whether there is an existing circuit feature in the area;
   determining whether there is an existing circuit feature in an adjacent area that is adjacent to the area; and
   determining whether there is an existing circuit feature on an adjacent layer that is adjacent to a layer on which the area resides.

5. The computer implemented method of claim 4, the process further comprising:
   determining or identifying one or more characteristics of the existing circuit feature; and
   adjusting the assignment of one or more track patterns to the area based at least in part upon the one or more characteristics.

6. The computer implemented method of claim 4, the process further comprising:

tessellating the area into multiple, smaller sub-areas; and
accommodating the existing circuit feature by using at least one sub-area of the multiple, smaller sub-areas.

7. The computer implemented method of claim 1, the act of identifying the set of track patterns that match the circuit feature further comprising:
identifying one or more circuit feature attributes associated with the circuit feature;
identifying one or more track pattern attributes that correspond respectively to the one or more circuit feature attributes; and
determining if the one or more circuit feature attributes are compatible with the one or more circuit track pattern attributes, wherein
a matching track pattern is determined to match the circuit feature if at least one of the one or more circuit track pattern attributes is compatible with a corresponding circuit feature attribute of the circuit feature.

8. The computer implemented method of claim 1, the act of updating the assignment of the one or more track patterns to the area comprising:
identifying a count for a first track pattern of the one or more track patterns;
determining whether implementing the circuit feature in the area affects the count; and
modifying the count based at least in part upon a result of determining whether implementing the circuit feature in the area affects the count.

9. The computer implemented method of claim 1, the act of updating the assignment of the one or more track patterns to the area comprising:
identifying historical data from one or more similar electronic designs based at least in part upon contextual information of the area.

10. The computer implemented method of claim 9, the act of updating the assignment of the one or more track patterns to the area comprising:
identifying a context in which the area is situated in the electronic design;
identifying one or more areas situated within identical or similar context as the area is in the context from the one or more similar electronic designs;
identifying one or more track pattern assignments from the one or more similar electronic designs; and
modifying the set of track patterns based at least in part upon the one or more track pattern assignments.

11. The computer implemented method of claim 1, the act of implementing the circuit feature comprising:
identifying the one or more tracks from the part of the set of track patterns; and
using the one or more tracks to implement the circuit feature in the area.

12. The computer implemented method of claim 1, the process further comprising:
identifying a single track pattern from the set of track patterns; and
locking the assignment by associating only the single track pattern with the region.

13. The computer implemented method of claim 1, the process further comprising:
maintaining a tessellation structure for at least the area, wherein the tessellation structure includes information about the region and the assignment.

14. The computer implemented method of claim 1, the process further comprising:

determining a requirement that requires a total number of circuit features equal a count associated with a track pattern;
relaxing the requirement to allow for an error; and
leveraging the error in implementing a part of the area or the electronic design.

15. A system for automatically assigning track patterns to regions for physical implementation of an electronic design, comprising:
a computing system having at least one processor or at least one processor core that is to:
identify a set of one or more track patterns that match a circuit feature in an area of an electronic design, wherein a track pattern in the set includes multiple tracks, each of which has zero width and is used for implementing the area of the electronic design;
implement the circuit feature in the area of the electronic design by using one or more tracks identified from at least a part of the set of track patterns; and
update assignment of one or more track patterns to the area.

16. The system of claim 15, in which the at least one processor or at least one processor core is further to:
execute one or more sets of instructions of multiple sets of instructions to implement the physical electronic design with the area-bounded tracks, wherein
a first set of instructions of the multiple sets of instructions comprises a first sequence of instructions which, when executed by the at least one processor, causes the at least one processor to:
make all track patterns available for the region; and
determine whether or not one or more attributes of a track pattern in the all track patterns match one or more corresponding attributes of the circuit feature to be implemented in the area;
a second set of instructions of the multiple sets of instructions comprises a first sequence of instructions which, when executed by the at least one processor, causes the at least one processor to:
determine whether there is an existing circuit feature in the area;
determine whether there is an existing circuit feature in an adjacent area that is adjacent to the area; or
determine whether there is an existing circuit feature on an adjacent layer that is adjacent to a layer on which the area resides; and
a third set of instructions of the multiple sets of instructions comprises a first sequence of instructions which, when executed by the at least one processor, causes the at least one processor to:
determine or identify one or more characteristics of the existing circuit feature;
adjust the assignment of one or more track patterns to the area based at least in part upon the one or more characteristics;
tessellate the area into multiple, smaller sub-areas; and
accommodate the existing circuit feature by using at least one sub-area of the multiple, smaller sub-areas.

17. The system of claim 15, in which the at least one processor or at least one processor core that is to identify the set of track patterns that match the circuit feature is further to:
identify one or more circuit feature attributes associated with the circuit feature;
identify one or more track pattern attributes that correspond respectively to the one or more circuit feature attributes; and determine if the one or more circuit feature attributes are compatible with the one or more circuit track pattern attributes, wherein
a matching track pattern is determined to match the circuit feature if at least one of the one or more circuit track pattern attributes is compatible with a corresponding circuit feature attribute of the circuit feature.

18. The system of claim 15, in which the at least one processor or at least one processor core that is further to update the assignment of the one or more track patterns to the area is further to:
execute one or more sets of instructions of multiple sets of instructions to implement the physical electronic design with the area-bounded tracks, wherein
a first set of instructions of the multiple sets of instructions comprises a first sequence of instructions which, when executed by the at least one processor, causes the at least one processor to:
identify a count for a first track pattern of the one or more track patterns;
determine whether implementing the circuit feature in the area affects the count;
modify the count based at least in part upon a result of determining whether implementing the circuit feature in the area affects the count; and
identify historical data from one or more similar electronic designs based at least in part upon contextual information of the area; and
a second set of instructions of the multiple sets of instructions comprises a first sequence of instructions which, when executed by the at least one processor, causes the at least one processor to:
identify a context in which the area is situated in the electronic design;
identify one or more areas situated within identical or similar context as the area is in the context from the one or more similar electronic designs;
identify one or more track pattern assignments from the one or more similar electronic designs; and
modify the set of track patterns based at least in part upon the one or more track pattern assignments.

19. The system of claim 15, in which the at least one processor or at least one processor core is further to implement the circuit feature is further to:
identify the one or more tracks from the part of the set of track patterns; and
use the one or more tracks to implement the circuit feature in the area.

20. The system of claim 15, in which the at least one processor or at least one processor core is further to:
execute one or more sets of instructions of multiple sets of instructions to implement the physical electronic design with the area-bounded tracks, wherein
a first set of instructions of the multiple sets of instructions comprises a first sequence of instructions which, when executed by the at least one processor, causes the at least one processor to:
identify a single track pattern from the set of track patterns; and
lock the assignment by associating only the single track pattern with the region; and
a second set of instructions of the multiple sets of instructions comprises a first sequence of instructions which, when executed by the at least one processor, causes the at least one processor to:
determine a requirement that requires a total number of circuit features equal a count associated with a track pattern;
relax the requirement to allow for an error; and
leverage the error in implementing a part of the area or the electronic design.

21. An article of manufacture comprising a non-transitory computer accessible storage medium having stored thereupon a sequence of instructions which, when executed by at least one processor or at least one processor core executing one or more threads, causes the at least one processor or the at least one processor core to perform a method for automatically assigning track patterns to regions for physical implementation of an electronic design, the method comprising:
using at least one processor or at least one processor core to perform a process the process comprising:
identifying a set of one or more track patterns that match a circuit feature in an area of an electronic design, wherein a track pattern in the set includes multiple tracks, each of which has zero width and is used for implementing the area of the electronic design;
implementing the circuit feature in the area of the electronic design by using one or more tracks identified from at least a part of the set of track patterns; and
updating assignment of one or more track patterns to the area.

22. The article of manufacture of claim 21, the process further comprising:
one or more sub-processes of multiple sub-processes, wherein
a first sub-process of the multiple sub-processes comprises:
making all track patterns available for the region; and
determining whether or not one or more attributes of a track pattern in the all track patterns match one or more corresponding attributes of the circuit feature to be implemented in the area; and
a second sub-process of the multiple sub-processes comprises:
determining whether there is an existing circuit feature in the area;
determining whether there is an existing circuit feature in an adjacent area that is adjacent to the area; and
determining whether there is an existing circuit feature on an adjacent layer that is adjacent to a layer on which the area resides.

23. The article of manufacture of claim 22, the process further comprising:
determining or identifying one or more characteristics of the existing circuit feature;
adjusting the assignment of one or more track patterns to the area based at least in part upon the one or more characteristics;
tessellating the area into multiple, smaller sub-areas; and
accommodating the existing circuit feature by using at least one sub-area of the multiple, smaller sub-areas.

24. The article of manufacture of claim 21, the act of identifying the set of track patterns that match the circuit feature further comprising:
identifying one or more circuit feature attributes associated with the circuit feature;
identifying one or more track pattern attributes that correspond respectively to the one or more circuit feature attributes; and
determining if the one or more circuit feature attributes are compatible with the one or more circuit track pattern attributes, wherein a matching track pattern is determined to match the circuit feature if at least one of the one or more circuit track pattern attributes is compatible with a corresponding circuit feature attribute of the circuit feature.

25. The article of manufacture of claim 21, the act of updating the assignment of the one or more track patterns to the area comprising one or more sub-processes of multiple sub-processes, wherein:
   a first sub-process of the multiple sub-processes comprises:
      identifying a count for a first track pattern of the one or more track patterns;
      determining whether implementing the circuit feature in the area affects the count; and
      modifying the count based at least in part upon a result of determining whether implementing the circuit feature in the area affects the count; and
   a second sub-process of the multiple sub-processes comprises:
      identifying historical data from one or more similar electronic designs based at least in part upon contextual information of the area;
      identifying a context in which the area is situated in the electronic design;
      identifying one or more areas situated within identical or similar context as the area is in the context from the one or more similar electronic designs;
      identifying one or more track pattern assignments from the one or more similar electronic designs; and
      modifying the set of track patterns based at least in part upon the one or more track pattern assignments.

26. The article of manufacture of claim 21, the act of implementing the circuit feature comprising:
   identifying the one or more tracks from the part of the set of track patterns; and
   using the one or more tracks to implement the circuit feature in the area.

27. The article of manufacture of claim 25, the process further comprising:
   one or more sub-processes of multiple sub-processes, wherein
   a first sub-process of the multiple sub-processes comprises:
      identifying a single track pattern from the set of track patterns; and
      locking the assignment by associating only the single track pattern with the region; and
   a second sub-process of the multiple sub-processes comprises:
      determining a requirement that requires a total number of circuit features equal a count associated with a track pattern;
      relaxing the requirement to allow for an error; and
      leveraging the error in implementing a part of the area or the electronic design.

* * * * *